United States Patent
Wang et al.

(10) Patent No.: US 11,468,844 B2
(45) Date of Patent: *Oct. 11, 2022

(54) DISPLAY DEVICE INCLUDING A SUB-GATE ELECTRODE

(71) Applicant: Samsung Display Co., Ltd., Yongin-Si (KR)

(72) Inventors: Seong Min Wang, Yongin-si (KR); Young In Hwang, Yongin-si (KR); Jin Woo Park, Yongin-si (KR); Yong Ho Yang, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/172,132

(22) Filed: Feb. 10, 2021

(65) Prior Publication Data

US 2021/0174745 A1 Jun. 10, 2021

Related U.S. Application Data

(62) Division of application No. 16/279,746, filed on Feb. 19, 2019, now Pat. No. 10,950,177.

(30) Foreign Application Priority Data

Apr. 2, 2018 (KR) .......................... 10-2018-0038227

(51) Int. Cl.
*G09G 3/3266* (2016.01)
*H01L 27/32* (2006.01)
(Continued)

(52) U.S. Cl.
CPC ....... *G09G 3/3266* (2013.01); *H01L 27/3276* (2013.01); *H01L 29/78648* (2013.01);
(Continued)

(58) Field of Classification Search
CPC ......... G09G 3/3266; G09G 2310/0286; G09G 3/3258; G09G 2300/0426;
(Continued)

(56) References Cited

U.S. PATENT DOCUMENTS 7,759,863 B2 7/2010 Kim et al.
8,218,099 B2 7/2012 Yamazaki et al.
(Continued)

FOREIGN PATENT DOCUMENTS

KR 10-2017-0143052 A 12/2017

*Primary Examiner* — Temesghen Ghebretinsae
*Assistant Examiner* — Ivelisse Martinez Quiles
(74) *Attorney, Agent, or Firm* — Innovation Counsel LLP

(57) ABSTRACT

A display device may include a first pixel coupled to an emission control line, and an emission control stage for selectively coupling the emission control line to a first or second supply voltage line. The emission control stage may include: a first emission control transistor including a first electrode coupled to the first supply voltage line, a second electrode coupled to the emission control line, and a main gate electrode coupled to a first node; a second emission control transistor including a first electrode coupled to the emission control line, a second electrode coupled to the second supply voltage line, and a main gate electrode coupled to a second node; and a third emission control transistor including a first electrode coupled to the first supply voltage line, a second electrode coupled to the first node, a main gate electrode coupled to the second node, and a sub-gate electrode.

2 Claims, 16 Drawing Sheets

(51) Int. Cl.
*H01L 29/786* (2006.01)
*H01L 27/12* (2006.01)
*G09G 3/3258* (2016.01)

(52) U.S. Cl.
CPC ... *G09G 3/3258* (2013.01); *G09G 2300/0426* (2013.01); *G09G 2310/0286* (2013.01); *G09G 2310/0297* (2013.01); *G09G 2320/0247* (2013.01); *H01L 27/124* (2013.01)

(58) Field of Classification Search
CPC ... G09G 2310/0297; G09G 2320/0247; G09G 2300/0819; G09G 2300/0842; G09G 2300/0861; G09G 2310/08; G09G 2320/045; G09G 3/3233; G09G 2230/00; G09G 2320/0214; H01L 27/3276; H01L 29/78648; H01L 27/124; H01L 27/3244; H01L 51/50
See application file for complete search history.

(56) References Cited

U.S. PATENT DOCUMENTS

| | | | |
|---|---|---|---|
| 9,349,751 | B2 | 5/2016 | Yamazaki et al. |
| 10,950,177 | B2* | 3/2021 | Wang ............... H01L 29/78648 |
| 2011/0102409 | A1 | 5/2011 | Hayakawa |
| 2014/0002426 | A1 | 1/2014 | Tanada et al. |
| 2014/0055444 | A1 | 2/2014 | Jang |
| 2015/0171115 | A1* | 6/2015 | Yamazaki ......... H01L 21/76816 |
| | | | 257/43 |
| 2017/0033792 | A1 | 2/2017 | Takahash et al. |
| 2017/0047009 | A1 | 2/2017 | Lee et al. |
| 2017/0117343 | A1 | 4/2017 | Oh et al. |
| 2017/0206837 | A1* | 7/2017 | Jeon .................... G09G 3/3258 |
| 2017/0338295 | A1* | 11/2017 | Lee .................... H01L 27/3248 |
| 2017/0365211 | A1 | 12/2017 | Lee et al. |

* cited by examiner

DISPLAY DEVICE INCLUDING A SUB-GATE ELECTRODE

CROSS-REFERENCE TO RELATED APPLICATION

The present application a divisional application of U.S. patent application Ser. No. 16/279,746 filed on Feb. 19, 2019, which claims priority under 35 USC § 119 to Korean patent application number 10-2018-0038227 filed on Apr. 2, 2018, in the Korean Intellectual Property Office, the disclosures of which are incorporated herein in their entirety by reference.

BACKGROUND

Field

Various embodiments of the present disclosure relates to a display device.

Description of Related Art

With the development of information technology, the importance of a display device that is a connection medium between a user and information has been emphasized. Owing to the importance of the display device, the use of various display devices such as a liquid crystal display device, an organic light-emitting display device, and a plasma display device has increased.

A display device includes pixels and is operated in such a way that each pixel is supplied with a corresponding data voltage and thus emits light. Each pixel emits light with a luminance corresponding to a data voltage applied thereto. A display image may be expressed by a combination of light emission of the pixels.

The display device includes a plurality of transistors. Depending on layouts or manufacturing processes, there may be transistors that are prone to current leakage. If current leakage occurs, there is a problem in that flicker is visible to a user.

SUMMARY

Various embodiments of the present disclosure are directed to a display device using a sub-gate electrode, thus preventing current leakage, and reducing a dead space.

An embodiment of the present disclosure provides a display device including: a first pixel coupled to an emission control line; and an emission control stage configured to selectively couple the emission control line to a first supply voltage line or a second supply voltage line. The emission control stage may include: a first emission control transistor including a first electrode coupled to the first supply voltage line, a second electrode coupled to the emission control line, and a main gate electrode coupled to a first node; a second emission control transistor including a first electrode coupled to the emission control line, a second electrode coupled to the second supply voltage line, and a main gate electrode coupled to a second node; and a third emission control transistor including a first electrode coupled to the first supply voltage line, a second electrode coupled to the first node, a main gate electrode coupled to the second node, and a sub-gate electrode.

In an embodiment, the sub-gate electrode of the third emission control transistor may be coupled to the second node.

In an embodiment, the main gate electrode of the third emission control transistor may be disposed over an active layer, and the sub-gate electrode of the third emission control transistor may be disposed under the active layer.

In an embodiment, each of the first emission control transistor and the second emission control transistor may include a sub-gate electrode. The sub-gate electrode of the first emission control transistor may be coupled to the main gate electrode of the first emission control transistor. The sub-gate electrode of the second emission control transistor may be coupled to the main gate electrode of the second emission control transistor.

In an embodiment, the main gate electrode of the first emission control transistor and the main gate electrode of the second emission control transistor may be disposed over the active layer. The sub-gate electrode of the first emission control transistor and the sub-gate electrode of the second emission control transistor may be disposed under the active layer.

In an embodiment, the first pixel may be further coupled to a scan line. The display device may further include a scan stage configured to selectively couple the scan line to the first supply voltage line or a scan clock line. The scan stage may include: a first scan transistor including a first electrode coupled to the first supply voltage line, a second electrode coupled to the scan line, and a main gate electrode and a sub-gate electrode coupled to each other; and a second scan transistor including a first electrode coupled to the scan line, a second electrode coupled to the scan clock line, and a main gate electrode and a sub-gate electrode coupled to each other.

In an embodiment, the main gate electrode of the first scan transistor and the main gate electrode of the second scan transistor may be disposed over the active layer. The sub-gate electrode of the first scan transistor and the sub-gate electrode of the second scan transistor may be disposed under the active layer.

In an embodiment, the first pixel may be further coupled to a first data line. The display device may further include: a second pixel coupled to a second data line; and a demux configured to couple a data supply line to either the first data line or the second data line. The demux may include: a first demux transistor including a first electrode coupled to the data supply line, a second electrode coupled to the first data line, and a main gate electrode and a sub-gate electrode coupled to a first select control line; and a second demux transistor including a first electrode coupled to the data supply line, a second electrode coupled to the second data line, and a main gate electrode and a sub-gate electrode coupled to a second select control line.

In an embodiment, the main gate electrode of the first demux transistor and the main gate electrode of the second demux transistor may be disposed over the active layer. The sub-gate electrode of the first demux transistor and the sub-gate electrode of the second demux transistor may be disposed under the active layer.

In an embodiment, the sub-gate electrode of the third emission control transistor may be coupled to the first supply voltage line.

In an embodiment, the main gate electrode of the third emission control transistor may be disposed over an active layer. The sub-gate electrode of the third emission control transistor may be disposed under the active layer.

An embodiment of the present disclosure provides a display device including: a pixel coupled to an emission control line; and an emission control stage configured to selectively couple the emission control line to a first supply voltage line or a second supply voltage line. The emission control stage may include: a first emission control transistor including a first electrode coupled to the first supply voltage line, a second electrode coupled to the emission control line, a main gate electrode coupled to a first node, and a sub-gate electrode; and a second emission control transistor including a first electrode coupled to the emission control line, a second electrode coupled to the second supply voltage line, a main gate electrode coupled to a second node, and a sub-gate electrode.

In an embodiment, the main gate electrode of the first emission control transistor and the main gate electrode of the second emission control transistor may be disposed over an active layer, and the sub-gate electrode of the first emission control transistor and the sub-gate electrode of the second emission control transistor may be disposed under the active layer.

An embodiment of the present disclosure provides a display device including: a first pixel coupled to a scan line; and a scan stage configured to selectively couple the scan line to a first supply voltage line or a scan clock line. The scan stage may include: a first scan transistor including a first electrode coupled to the first supply voltage line, a second electrode coupled to the scan line, and a main gate electrode and a sub-gate electrode coupled to each other; and a second scan transistor including a first electrode coupled to the scan line, a second electrode coupled to the scan clock line, and a main gate electrode and a sub-gate electrode coupled to each other.

In an embodiment, the main gate electrode of the first scan transistor and the main gate electrode of the second scan transistor may be disposed over the active layer. The sub-gate electrode of the first scan transistor and the sub-gate electrode of the second scan transistor may be disposed under the active layer.

An embodiment of the present disclosure provides a display device including: a first pixel coupled to a first data line; a second pixel coupled to a second data line; and a demux configured to couple a data supply line to either the first data line or the second data line. The demux may include: a first demux transistor including a first electrode coupled to the data supply line, a second electrode coupled to the first data line, and a main gate electrode and a sub-gate electrode coupled to a first select control line; and a second demux transistor including a first electrode coupled to the data supply line, a second electrode coupled to the second data line, and a main gate electrode and a sub-gate electrode coupled to a second select control line.

In an embodiment, the main gate electrode of the first demux transistor and the main gate electrode of the second demux transistor may be disposed over the active layer, and the sub-gate electrode of the first demux transistor and the sub-gate electrode of the second demux transistor may be disposed under the active layer.

DETAILED DESCRIPTION

Figure 1:
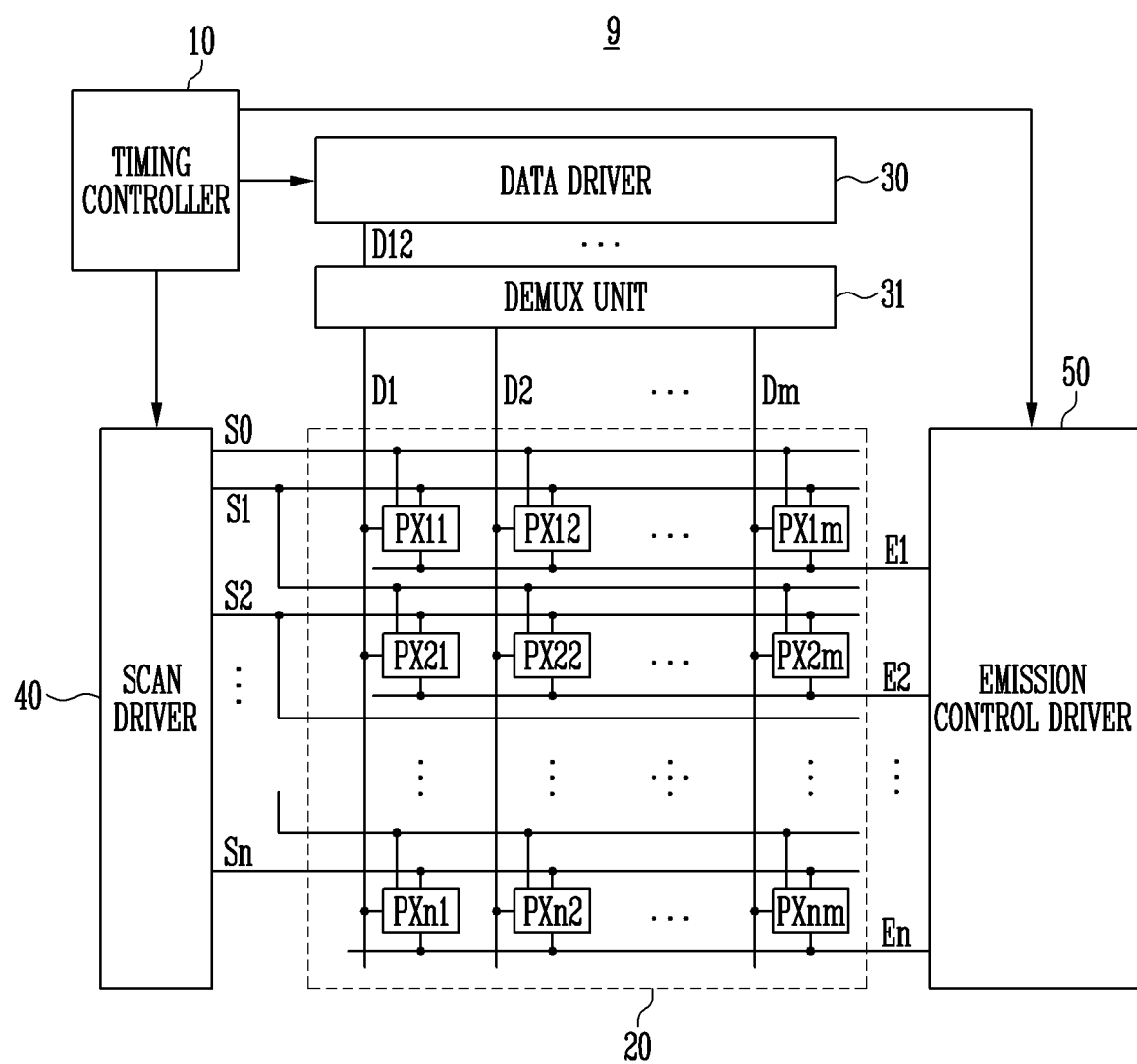
FIG. 1 is a diagram illustrating a display device in accordance with an embodiment of the present disclosure.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram illustrating a display device 9 in accordance with an embodiment of the present disclosure.

Referring to FIG. 1, the display device 9 in accordance with the present embodiment may include a timing controller 10, a plurality of pixels 20, a data driver 30, a demux 31, a scan driver 40, and an emission control driver 50.

The timing controller 10 may convert a control signal and an image signal supplied from a process (e.g., an application processor) into signals corresponding to specifications of the display device 9, and may supply a required control signal and a required image signal to the data driver 30, the scan driver 40, and the emission control driver 50.

The plurality of pixels 20 may include pixels PX11, PX12, ..., PX1m, PX21, PX22, ..., PX2m, ..., PXn1, PXn2, ..., PXnm. The pixels PX11 to PXnm may be coupled to corresponding data lines D1, D2, ..., Dm, corresponding scan lines S0, S1, S2, ..., Sn, and corresponding emission control lines E1, E2, ..., En. Each pixel may receive a data voltage from the corresponding data line in response to a scan signal received from the corresponding scan line. Each pixel may emit light with a luminance corresponding to the data voltage in response to an emission control signal received from the corresponding emission control line. The configuration of each pixel will be described later herein with reference to FIGS. 17 and 18.

The data driver 30 may receive a control signal and an image signal from the timing controller 10 and generate data voltages to be supplied to data supply lines D12, .... Depending on points in time, the data driver 30 may apply, to the data supply lines D12, ..., data voltages to be supplied to the data lines D1, D3, ... disposed on odd-number-th columns, or may apply, to the data supply lines D12, ..., data voltages to be supplied to the data lines D2, D4, ... disposed on even-number-th columns.

The demux 31 may apply the data voltages received through the data supply lines D12, ..., to the data lines D1, D3, ... disposed on the odd-number-th columns or the data lines D2, D4, ... disposed on the even-number-th columns, depending on points in time. The configuration of the demux 31 will be described later herein with reference to FIGS. 14 to 16.

The scan driver 40 may receive a control signal from the timing controller 10 and generate scan signals to be supplied to the scan lines S0 to Sn. In an embodiment, the scan driver 40 may sequentially supply the scan signals to the scan lines S0 to Sn. Here, each scan signal may be supplied in the form of a pulse. The number of pulses may be set to different values depending on embodiments. The scan driver 40 may be configured in the form of a shift register, and thus generate scan signals in such a way that a scan start signal is sequentially transmitted to a subsequent stage circuit under control of a clock signal. The configuration of the scan driver 40 will be described later herein with reference to FIGS. 11 to 13.

The emission control driver 50 may supply emission control signals for determining emission durations of the pixels PX11 to PXnm, to the emission control lines E1 to En. For example, the emission of each pixel may be controlled in such a way that whether current flows to an organic light-emitting diode is determined depending on a voltage level of a corresponding emission control signal. In an embodiment, the emission control driver 50 may have a simultaneous emission structure in which all pixel rows simultaneously emit light. Hereinafter, with reference to FIGS. 2 to 10, description will be made for an emission control driver 50 having a sequential emission structure in which pixel rows sequentially emit light.

Figure 2:
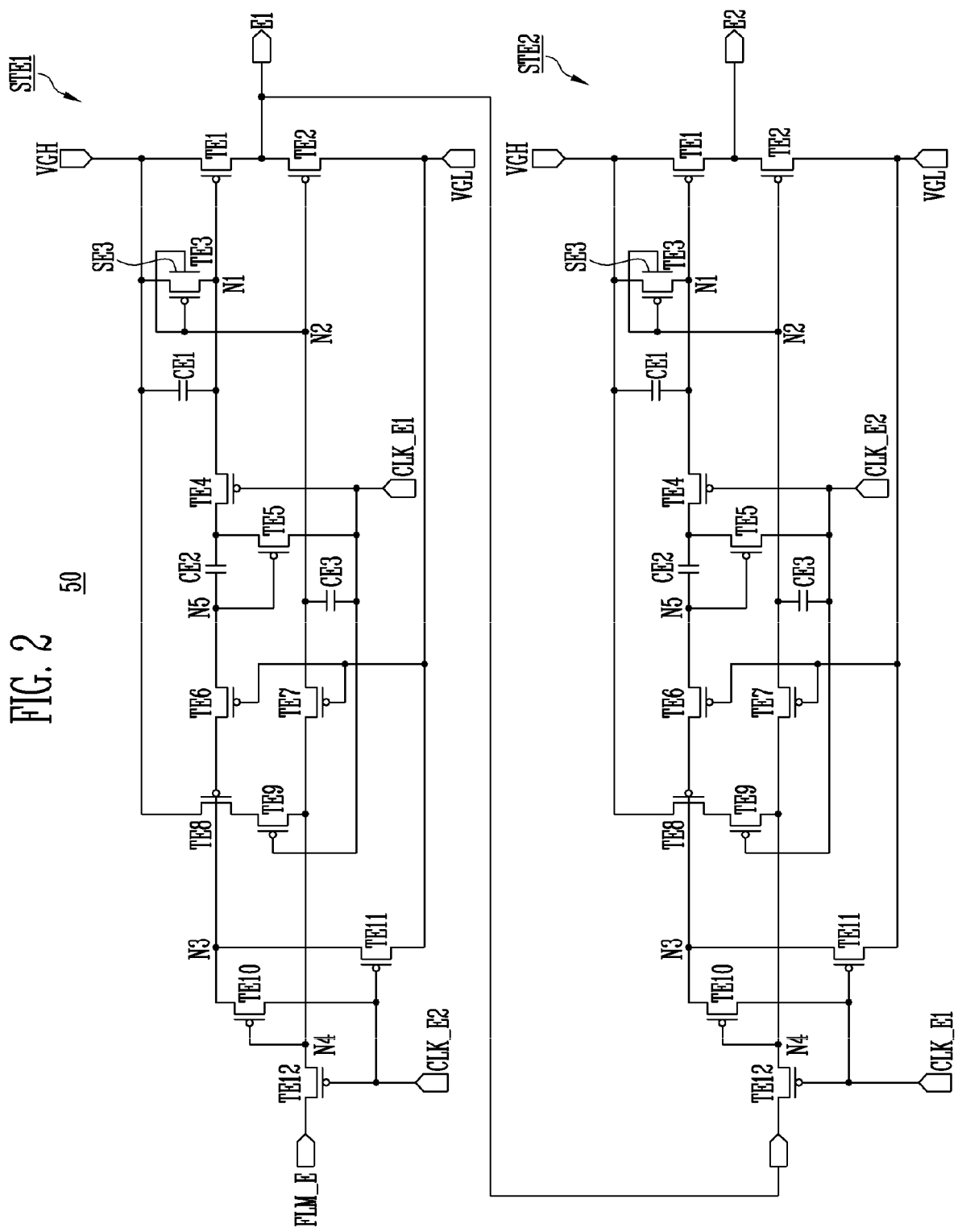
FIG. 2 is a diagram illustrating an emission control driver in accordance with an embodiment of the present disclosure.

FIG. 2 is a diagram illustrating the emission control driver 50 in accordance with an embodiment of the present disclosure.

Referring to FIG. 2, the emission control driver 50 in accordance with the present embodiment may include emission control stages STE1, STE2, ....

Each of the emission control stages STE1, STE2, ... may be configured in the form of a shift register in which a current emission control stage outputs a current emission control signal based on a preceding emission control signal outputted from a preceding emission control stage. However, the first emission control stage STE1 may receive an emission control start signal and operate based on the emission control start signal because it cannot receive a preceding emission control signal.

Each of the emission control stages STE1, STE2, ... may be coupled to a first emission control clock line CLK_E1, a second emission control clock line CLK_E2, a first supply voltage line VGH, and a second supply voltage line VGL. The first emission control clock line CLK_E1 and the second emission control clock line CLK_E2 may be sequentially alternately coupled to the emission control stages STE1, STE2, .... A voltage to be applied to the first supply voltage line VGH may be higher than a voltage to be applied to the second supply voltage line VGL. Each of the emission control stages STE1, STE2, ... may selectively couple the first supply voltage line VGH or the second supply voltage line VGL to the corresponding emission control line E1, E2, ....

The internal configurations of the emission control stages STE1, STE2, ... are substantially the same as each other; therefore, hereinafter, the first emission control stage STE1 will be described by way of example.

The first emission control stage STE1 may include emission control transistors TE1, TE, TE3, TE4, TE5, TE6, TE7, TE8, TE9, TE10, TE11, and TE12, and capacitors CE1, CE2, and CE3.

Hereinbelow, all of the transistors will be described as being P-type transistors, but those skilled in this art will appreciate that N-type transistors may be used as needed. The term "P-type transistor" is a general name for transistors in which the amount of flowing current increases when a voltage difference between a gate terminal and a source terminal increases in a negative direction. The term "N-type transistor" is a general name for transistors in which the amount of flowing current increases when a voltage difference between a gate terminal and a source terminal increases in a positive direction. Each transistor may be configured in various forms such as a thin film transistor (TFT), a field effect transistor (FET), and a bipolar junction transistor (BJT).

The first emission control transistor TE1 may include a first electrode coupled to the first supply voltage line VGH, a second electrode coupled to the emission control line E1, and a gate electrode coupled to a first node N1.

The second emission control transistor TE2 may include a first electrode coupled to the emission control line E1, a second electrode coupled to the second supply voltage line VGL, and a gate electrode coupled to a second node N2.

The third emission control transistor TE3 may include a first electrode coupled to the first supply voltage line VGH, a second electrode coupled to the first node N1, a main gate electrode coupled to the second node N2, and a sub-gate electrode SE3 coupled to the main gate electrode. In the present embodiment, the sub-gate electrode SE3 of the third emission control transistor TE3 may be coupled to the second node N2.

The fourth emission control transistor TE4 may include a first electrode coupled to the first node N1, a second electrode coupled to a first electrode of the fifth emission control transistor TE5, and a gate electrode coupled to the first emission control clock line CLK_E1.

The fifth emission control transistor TE5 may include the first electrode coupled to the second electrode of the fourth emission control transistor TE4, a second electrode coupled to the first emission control clock line CLK_E1, and a gate electrode coupled to a fifth node N5.

The sixth emission control transistor TE6 may include a first electrode coupled to the fifth node N5, a second electrode coupled to a third node N3, and a gate electrode coupled to the second supply voltage line VGL.

The seventh emission control transistor TE7 may include a first electrode coupled to the second node N2, a second electrode coupled to a fourth node N4, and a gate electrode coupled to the second supply voltage line VGL.

The eighth emission control transistor TE8 may include a first electrode coupled to the first supply voltage line VGH, a second electrode coupled to a first electrode of the ninth emission control transistor TE9, and a gate electrode coupled to the fifth node N5 via the sixth emission control transistor TE6.

The ninth emission control transistor TE9 may include the first electrode coupled to the second electrode of the eighth emission control transistor TE8, a second electrode coupled to the fourth node N4, and a gate electrode coupled to the first emission control clock line CLK_E1.

The tenth emission control transistor TE10 may include a first electrode coupled to the third node N3, a second electrode coupled to the second emission control clock line CLK_E2, and a gate electrode coupled to the fourth node N4.

The eleventh emission control transistor TE11 may include a first electrode coupled to the third node N3, a second electrode coupled to the second supply voltage line VGL, and a gate electrode coupled to the second emission control clock line CLK_E2.

The twelfth emission control transistor TE12 may include a first electrode coupled to the fourth node N4, a second electrode coupled to an emission control start line FLM_E, and a gate electrode coupled to the second emission control clock line CLK_E2.

The capacitor CE1 may include a first electrode coupled to the first supply voltage line VGH, and a second electrode coupled to the first node N1.

The capacitor CE2 may include a first electrode coupled to the second electrode of the fourth emission control transistor TE4, and a second electrode coupled to the fifth node N5.

The capacitor CE3 may include a first electrode coupled to the second node N2, and a second electrode coupled to the first emission control clock line CLK_E1.

Figure 3:
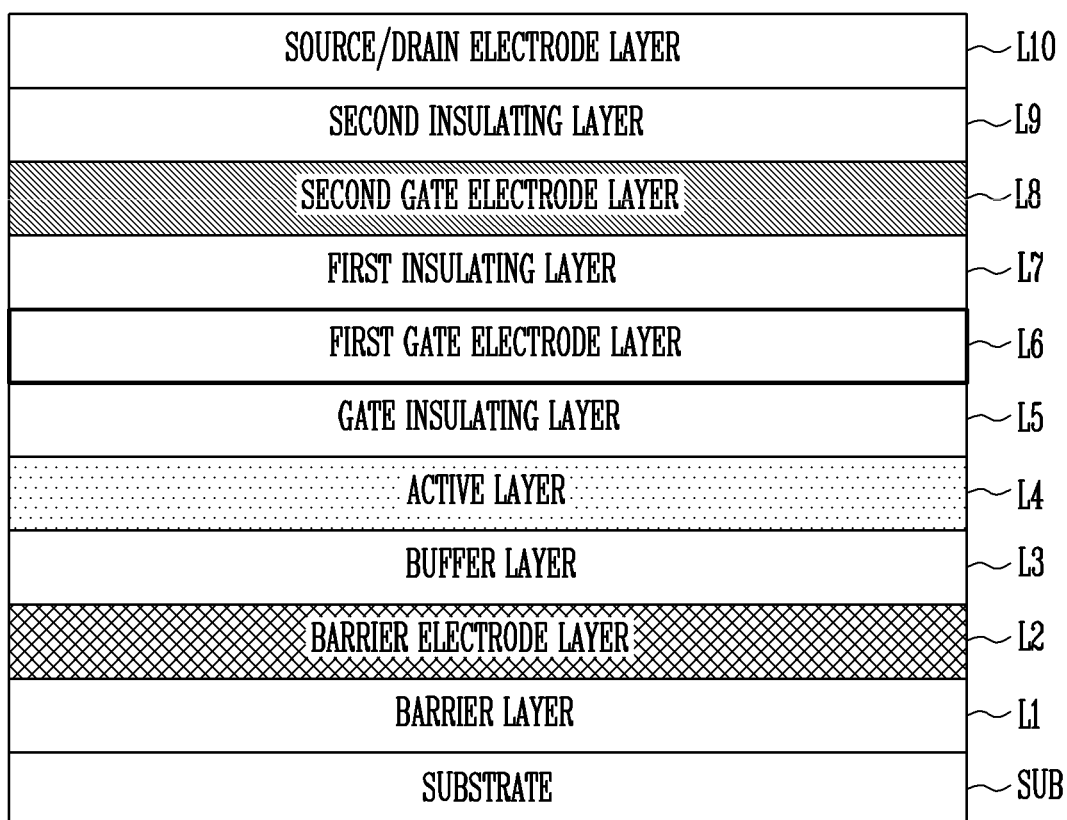
FIG. 3 is a diagram illustrating a structure of transistors in accordance with an embodiment of the present disclosure.

FIG. 3 is a diagram illustrating a structure of transistors in accordance with an embodiment of the present disclosure.

Referring to FIG. 3, in embodiments of the present disclosure, each element may be formed by patterning at least some of a structure in which a substrate SUB, a barrier layer L1, a barrier electrode layer L2, a buffer layer L3, an active layer L4, a gate insulating layer L5, a first gate electrode layer L6, a first insulating layer L7, a second gate electrode layer L8, a second insulating layer L9, and a source/drain electrode layer L10 are successively stacked.

The substrate SUB may be formed of various materials such as glass, a polymer, and metal. Any one of a rigid substrate and a flexile substrate may be selected as the substrate SUB depending on applications of products. In the case where the substrate SUB is formed to include polymer organic material, the substrate SUB may be made of material such as polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate. On the other hand, the substrate SUB may be formed of fiber glass reinforced plastic (FRP).

The barrier layer L1 and the buffer layer L3 may be layers which are selectively formed to prevent impurities of the substrate SUB from being diffused into the active layer L4 made of a semiconductor or prevent moisture from permeating the active layer L4. The barrier layer L1 and the buffer layer L3 may be formed of silicon nitride (SiNx), silicon oxide (SiOx), or silicon oxynitride (SiOxNy).

The active layer L4 may be a semiconductor layer. For example, the active layer L4 may be formed of material such as poly silicon, amorphous silicon, an oxide semiconductor, or an organic semiconductor. The active layer L4 may form a channel of each of the transistors TE1 to TE12. A junction between the active layer L4 and the source/drain electrode layer L10 may be doped with impurities.

The barrier electrode layer L2, the first gate electrode layer L6, the second gate electrode layer L8, and the source/drain electrode layer L10 may be conductive layers. Each electrode layer may have a single-layer structure or a multi-layer structure and be formed using gold (Au), silver (Ag), aluminum (Al), molybdenum (Mo), chrome (Cr), titanium (Ti), nickel (Ni), neodymium (Nd), copper (Cu), platinum (Pt), etc.

The barrier electrode layer L2 is disposed between the barrier layer L1 and the buffer layer L3. Particularly, the barrier electrode layer L2 may be required as an electrode layer for forming a sub-gate electrode for elements to be described later herein.

Furthermore, the first gate electrode layer L6 may be required as an electrode layer for forming a gate electrode or a main gate electrode for elements to be described later herein. Hereinafter, the term "gate electrode" may refer to a main gate electrode unless it is specified as being a sub-gate electrode.

The gate insulating layer L5, the first insulating layer L7, and the second insulating layer L9 may be interposed to electrically separate the active layer L4 and the electrode layers L6, L8, and L10 from each other. Through a contact hole formed in each insulating layer L5, L7, L9, corresponding patterns may be coupled to each other. The insulating layers L5, L7, and L9 may be formed of an organic insulating layer, an inorganic insulating layer, or an organic/ inorganic insulating layer, and may have a single-layer structure or a multi-layer structure.

Figure 4:
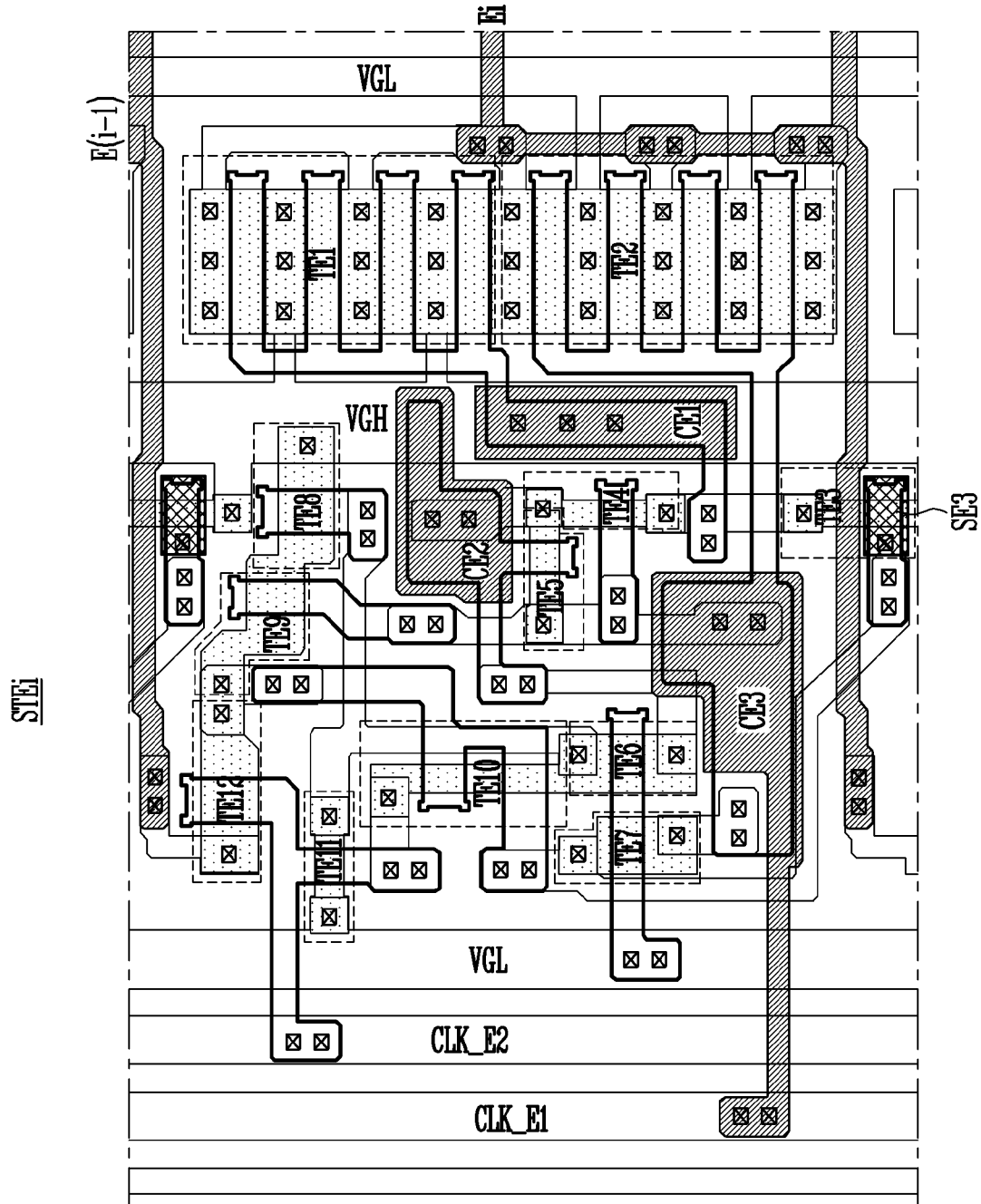
FIG. 4 is a diagram illustrating a layout of the emission control driver in accordance with the embodiment of FIG. 2.

FIG. 4 is a diagram illustrating a layout of the emission control driver 50 in accordance with the embodiment of FIG. 2.

Referring to FIG. 4, there is illustrated a layout of an arbitrary emission control stage STEi of the emission control driver 50.

In FIG. 4, the emission control stage STEi is illustrated using the barrier electrode layer L2, the active layer L4, the first gate layer L6, the second gate layer L8, and the source/drain electrode layer L10. For reference, the source/drain electrode layer L10 is indicated by solid border lines. Contact holes formed to couple different electrode layers to each other are indicated by "X"-marked boxes.

In the case of the transistors TE1 to TE12, the channels may be formed of the active layer L4, the gate electrodes may be formed of the first gate electrode layer L6, and the first electrodes/the second electrodes may be formed of the source/drain electrode layer L10. However, depending on a doping degree of the active layer L4, there may be a portion which partially has characteristics of a conductor rather than a semiconductor. Furthermore, the first electrodes/second electrodes of the transistors TE1 to TE12 may be defined on the active layer L4.

In the case of the capacitors CE1 to CE3, the first electrodes/the second electrodes may be formed of the first gate electrode layer L6/the second gate electrode layer L8.

In the present embodiment, the third emission control transistor TE3 may include a main gate electrode formed of the first gate electrode layer L6, and a sub-gate electrode SE3 formed of the barrier electrode layer L2. The sub-gate electrode SE3 of the third emission control transistor TE3 may be coupled to the main gate electrode through a contact hole passing through the buffer layer L3, the active layer L4, and the gate insulating layer L5.

Figure 5:
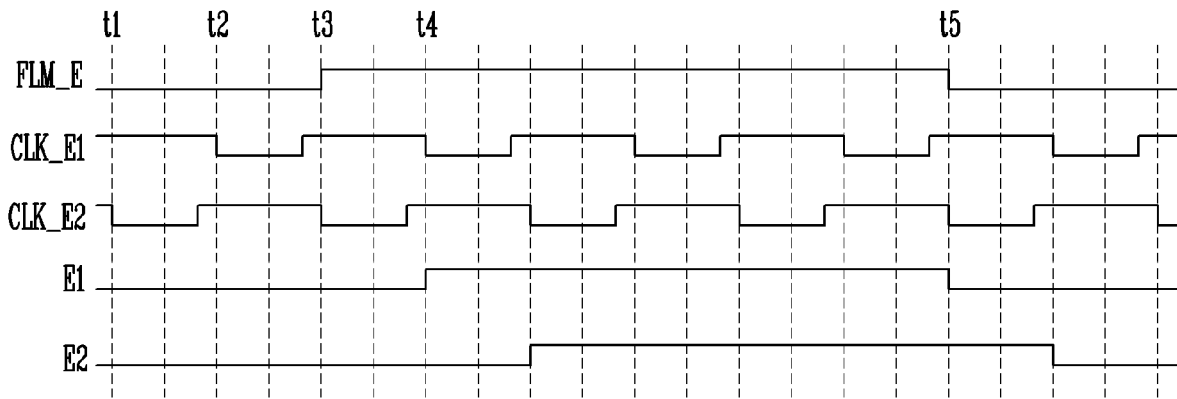
FIG. 5 is a timing chart for explaining a method of driving the emission control driver in accordance with the embodiment of FIG. 2.

FIG. 5 is a timing chart for explaining a method of driving the emission control driver 50 in accordance with the embodiment of FIG. 2.

Hereinafter, a signal applied to the emission control start line FLM_E will be referred to as an emission control start signal. A signal applied to the first emission control clock line CLK_E1 will be referred to as a first emission control clock signal. A signal applied to the second emission control clock line CLK_E2 will be referred to as a second emission control clock signal. A signal applied to the first emission control line E1 will be referred to as a first emission control signal. A signal applied to the second emission control line E2 will be referred to as a second emission control signal. In FIG. 5, there is illustrated the voltage level of each signal. In the description with reference to FIG. 5, the voltage level of each signal will be described as being one of a low level and a high level.

In FIG. 5, a horizontal interval between vertical broken lines may refer to one horizontal period.

At time t1, the voltage level of the second emission control clock signal is changed to a low level, the emission control start signal remains at a low level, and the first emission control clock signal remains at a high level.

Hence, some emission control transistors TE2, TE3, TE5, TE6, TE7, TE8, TE10, TE11, and TE12 are in a turned-on state, and the other emission control transistors TE1, TE4, and TE9 are in a turned-off state. The second power voltage line VGL is coupled to the first emission control line E1 through the turned-on second emission control transistor TE2. Therefore, the first emission control signal having a low level is applied to the first emission control line E1.

Thereafter, if the voltage level of the second emission control clock signal is changed to a high level, the tenth emission control transistor TE10 remains turned on due to the capacitor CE3, and the second emission control clock signal having the high level is applied to the third node N3 and the fifth node N5.

At time t2, the voltage level of the first emission control clock signal is changed to a low level, the emission control start signal remains at the low level, and the second emission control clock signal remains at the high level.

Hence, some emission control transistors TE2, TE3, TE4, TE6, TE7, TE9, and TE10 are in a turned-on state, and the other emission control transistors TE1, TE5, TE8, TE11, and TE12 are in a turned-off state.

Here, the second node N2 is boosted to a level lower than the low level by capacitive coupling of the second node N2 with the first emission control clock line CLK_E1 through the capacitor CE3. Therefore, driving characteristics of the emission control transistors TE2 and TE3 may be enhanced.

Here, since the fourth node N4 is coupled to the second node N2 through the seventh emission control transistor TE7, the effect of boosting on the fourth node N4 may be limited, unlike that of the second node N2. Therefore, a voltage difference between the first electrode and the second electrode of the twelfth emission control transistor TE12 is minimized, so that the driving characteristics of the twelfth emission control transistor TE12 may be prevented from changing.

At time t3, the voltage level of the emission control start signal is changed to a high level, the voltage level of the second emission control clock signal is changed to a low level, and the first emission control clock signal remains at the high level.

Hence, some emission control transistors TE5, TE6, TE7, TE8, TE11, and TE12 are in a turned-on state, and the other emission control transistors TE1, TE2, TE3, TE4, TE9, and TE10 are in a turned-off state.

In detail, since the emission control start signal having the high level is applied to the second node N2 through the turned-on twelfth emission control transistor TE12, the second emission control transistor TE2 is turned off. Furthermore, because the first node N1 remains at the high level by the capacitor CE1, the first emission control transistor TE1 is also turned off. Hence, the first emission control signal may remain at the low level by the first emission control line E1 that floats.

At time t4, the voltage level of the first emission control clock signal is changed to a low level, the emission control start signal remains at a high level, and the second emission control clock signal remains at the high level.

Before time t4, the fifth emission control transistor TE5 is already turned on by the capacitor CE2. At time t4, the fifth node N5 may be boosted to a level lower than the low level by the first emission control clock signal the voltage level of which has been changed to the low level. Therefore, the eighth emission control transistor TE8 may be improved in driving characteristics, and turned on. The ninth emission control transistor TE9 is turned on by the first emission control clock signal. Therefore, the second node N2 is coupled to the first supply voltage line VGH. Here, the first emission control clock signal having the low level is applied to the first node N1 through the emission control transistors TE5 and TE4, so that the first emission control transistor TE1 is turned on. Thereby, the first emission control line E1 is coupled to the first supply voltage line VGH, and the first emission control signal has a high level.

Here, since the third node N3 is coupled to the fifth node N5 through the sixth emission control transistor TE6, the effect of boosting on the third node N3 may be limited, unlike that of the fifth node N5. Therefore, a voltage difference between the first electrode and the second electrode of the tenth emission control transistor TE10 is minimized, so that the driving characteristics of the tenth emission control transistor TE10 may be prevented from changing.

At time t5, the voltage level of the emission control start signal is changed to a low level, the voltage level of the second emission control clock signal is changed to a low level, and the first emission control clock signal remains at the high level.

Therefore, the emission transistors TE12, TE7, and TE2 are turned on, and the second supply voltage line VGL is coupled to the first emission control line E1, so that the first emission control signal having the low level is outputted.

Figure 6:
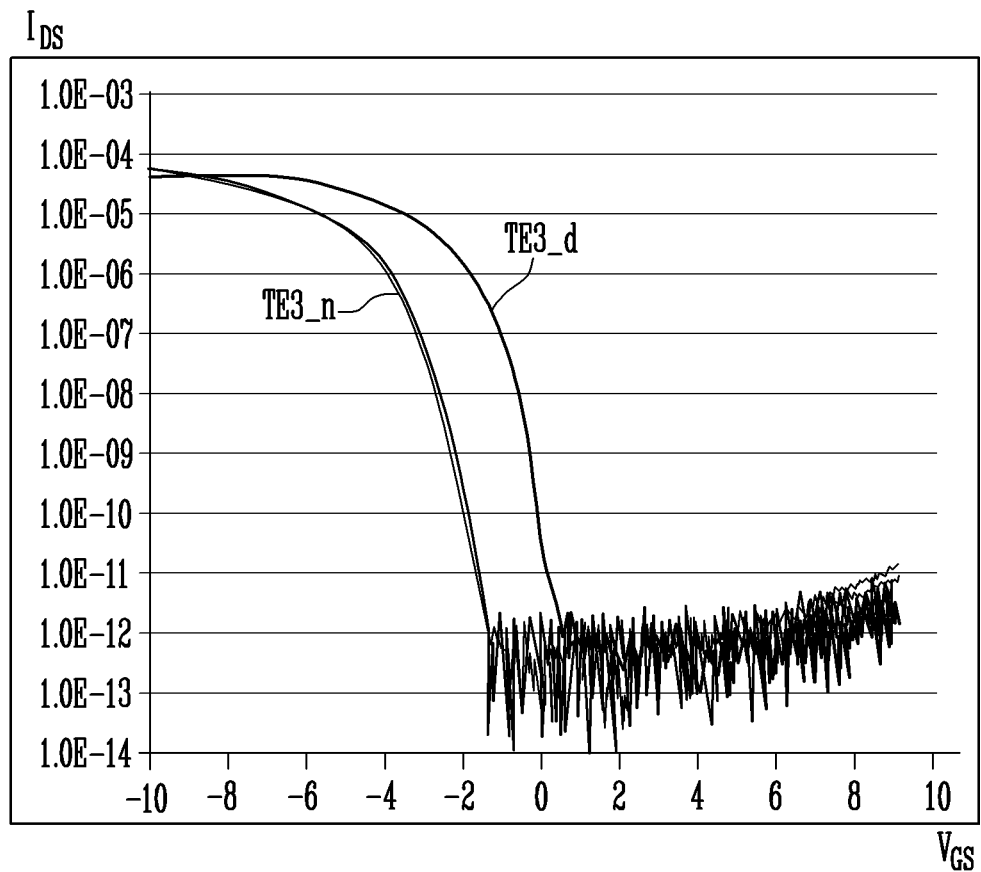
FIG. 6 is a diagram for explaining a leakage current reducing effect using a sub-gate electrode in accordance with an embodiment of the present disclosure.

FIG. 6 is a diagram for explaining a leakage current reducing effect using a sub-gate electrode in accordance with an embodiment of the present disclosure.

Referring to FIG. 6, there is illustrated a graph showing actually measured $I_{DS}$ current (current flowing from a drain electrode to a source electrode) as a function of a $V_{GS}$ voltage (a potential difference between a gate electrode and a source electrode) of the third emission control transistors included in the emission control stages of the emission control driver 50.

The actual measurement graph of FIG. 6 may be data measured to determine cause of a flicker phenomenon which occurs at low temperatures. As a result of the measurement, it has been determined that most third emission control transistors TE3_n are normal, but some third emission control transistors TE3_d have defective driving characteristics. Referring to FIG. 6, it can be checked that $V_{TH}$ (threshold voltage) of a defective third emission control transistor TE3_d is shifted by 2 V in a positive direction as compared to that of the normal third emission control transistors TE3_n. In this case, the defective third emission control transistor TE3_d has a defective turned-off state, unlike that of the normal case, so that leakage current flows even when it is turned off.

To overcome the foregoing problem, in the embodiment of FIGS. 2 and 3, the third emission control transistor TE3_d further includes the sub-gate electrode SE3 provided under the active layer L4 so that a voltage having a turn-off level is also applied from the second node N2 to the third emission control transistor TE3_d through the sub-gate electrode SE3, whereby even when the third emission control transistor TE3_d is defective, the amount of leakage current may be reduced. Consequently, the flicker phenomenon may be prevented from occurring.

Figure 7:
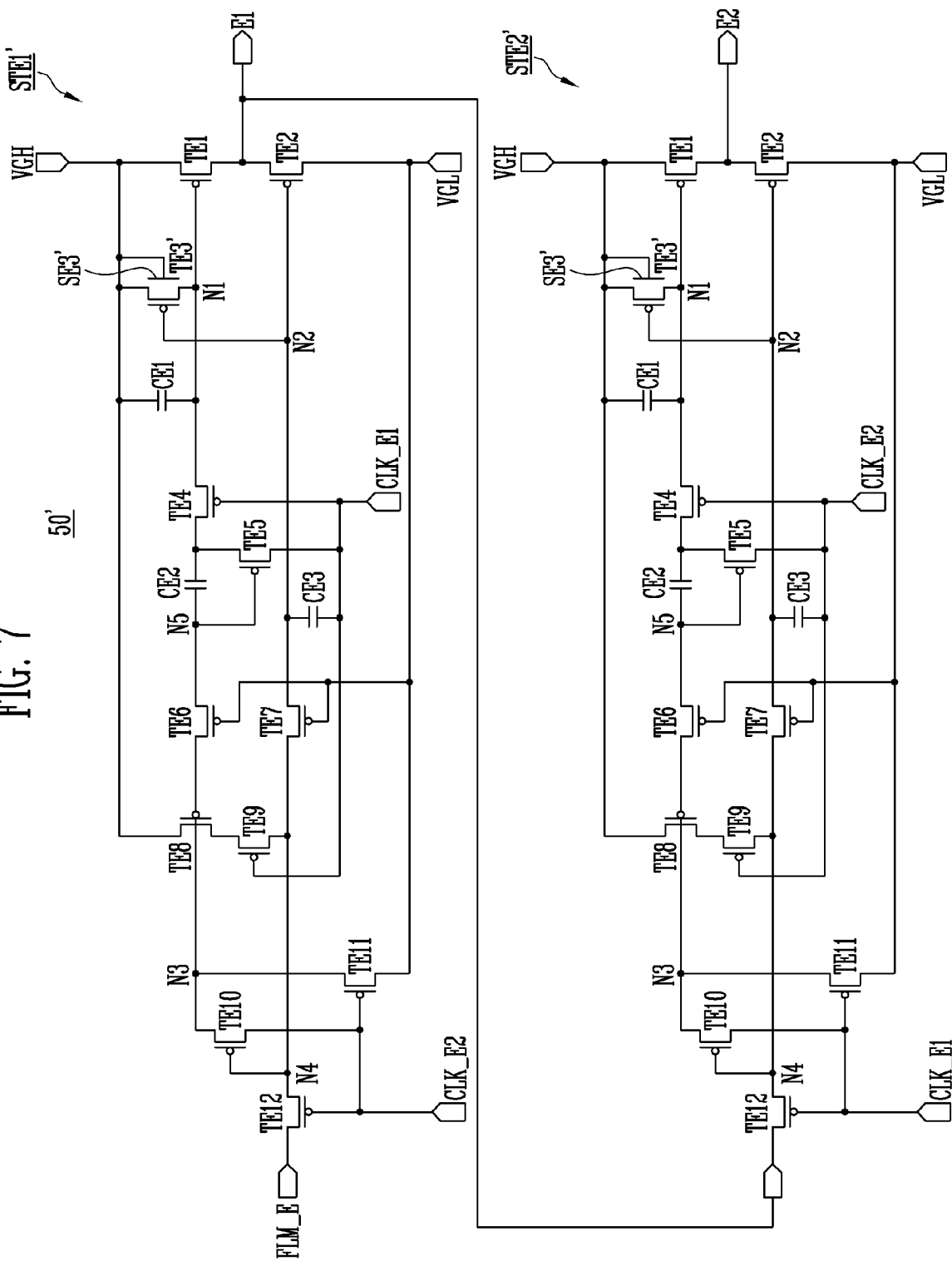
FIG. 7 is a diagram illustrating an emission control driver in accordance with an embodiment of the present disclosure.
Figure 8:
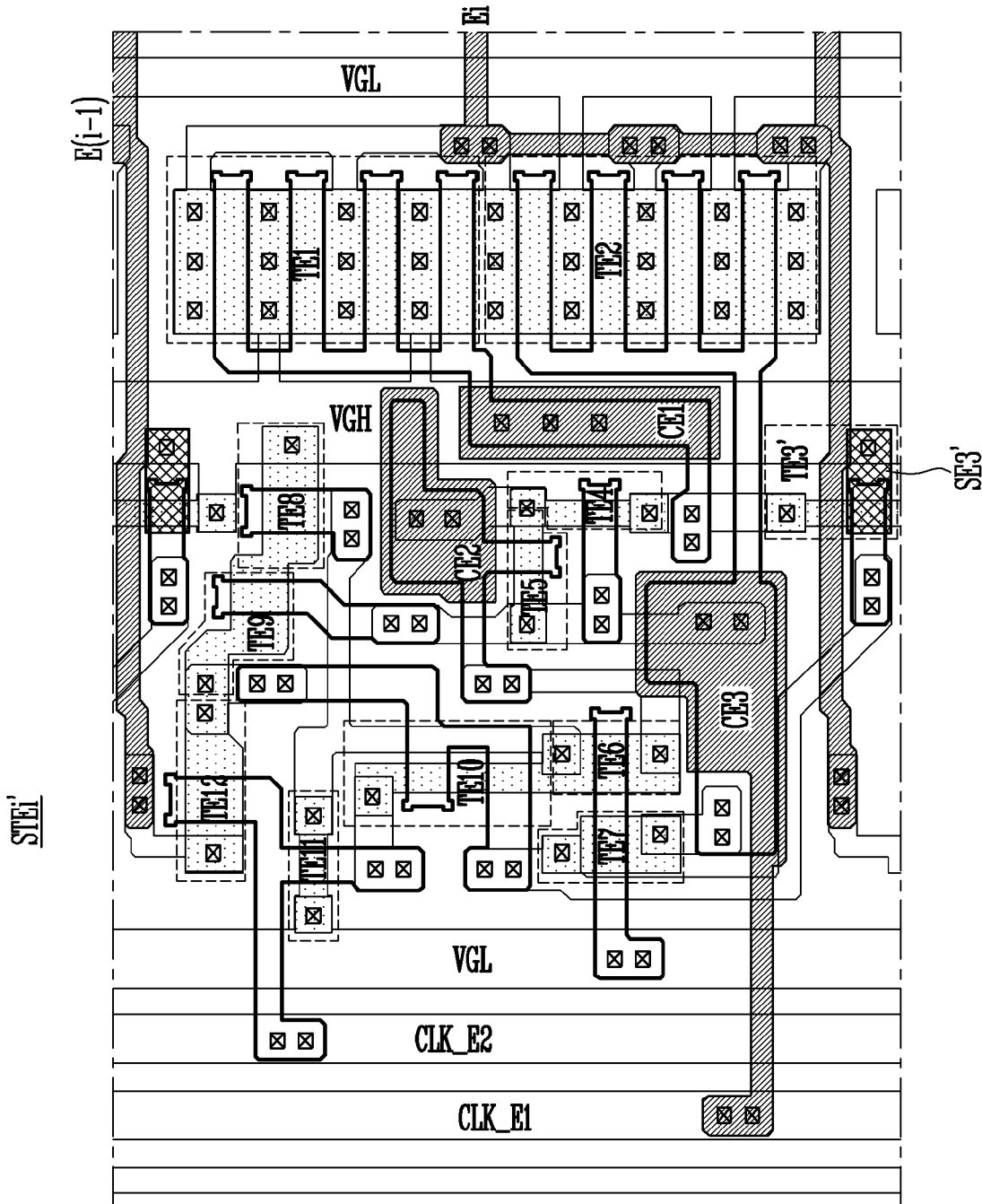
FIG. 8 is a diagram illustrating a layout of the emission control driver in accordance with the embodiment of FIG. 7.

FIG. 7 is a diagram illustrating an emission control driver 50' in accordance with an embodiment of the present disclosure. FIG. 8 is a diagram illustrating a layout of the emission control driver 50' in accordance with the embodiment of FIG. 7.

Referring to FIG. 7, the emission control driver 50' in accordance with the present embodiment may include emission control stages STE1', STE2', . . . .

In the embodiment of FIGS. 7 and 8, a sub-gate electrode SE3' of a third emission control transistor TE3' is coupled to the first supply voltage line VGH.

Since a first supply voltage corresponding to a turn-off level is applied through the sub-gate electrode SE3', a leakage current reducing effect may be obtained even when the third emission control transistor TE3' is defective. Here, depending on products, the area of the sub-gate electrode SE3' may be set to an appropriate value, whereby the third emission control transistor TE3' may be prevented from being always turned off.

The general configuration and driving method of the emission control driver 50' in accordance with the embodiment of FIGS. 7 and 8 are substantially the same as those of the emission control driver 50 of the embodiment of FIGS. 2 and 4; therefore, repetitive explanation will be omitted.

Figure 9:
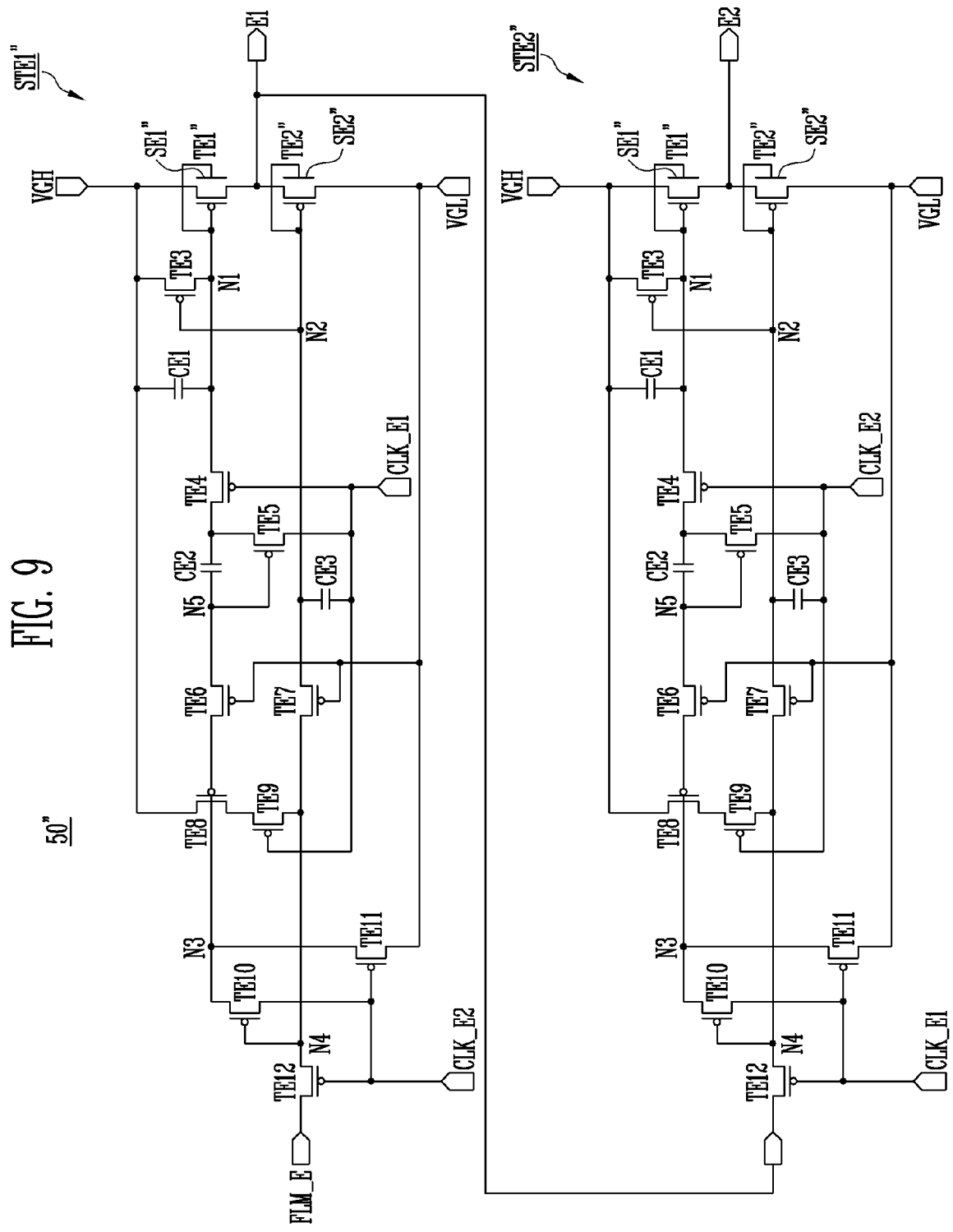
FIG. 9 is a diagram illustrating an emission control driver in accordance with an embodiment of the present disclosure
Figure 10:
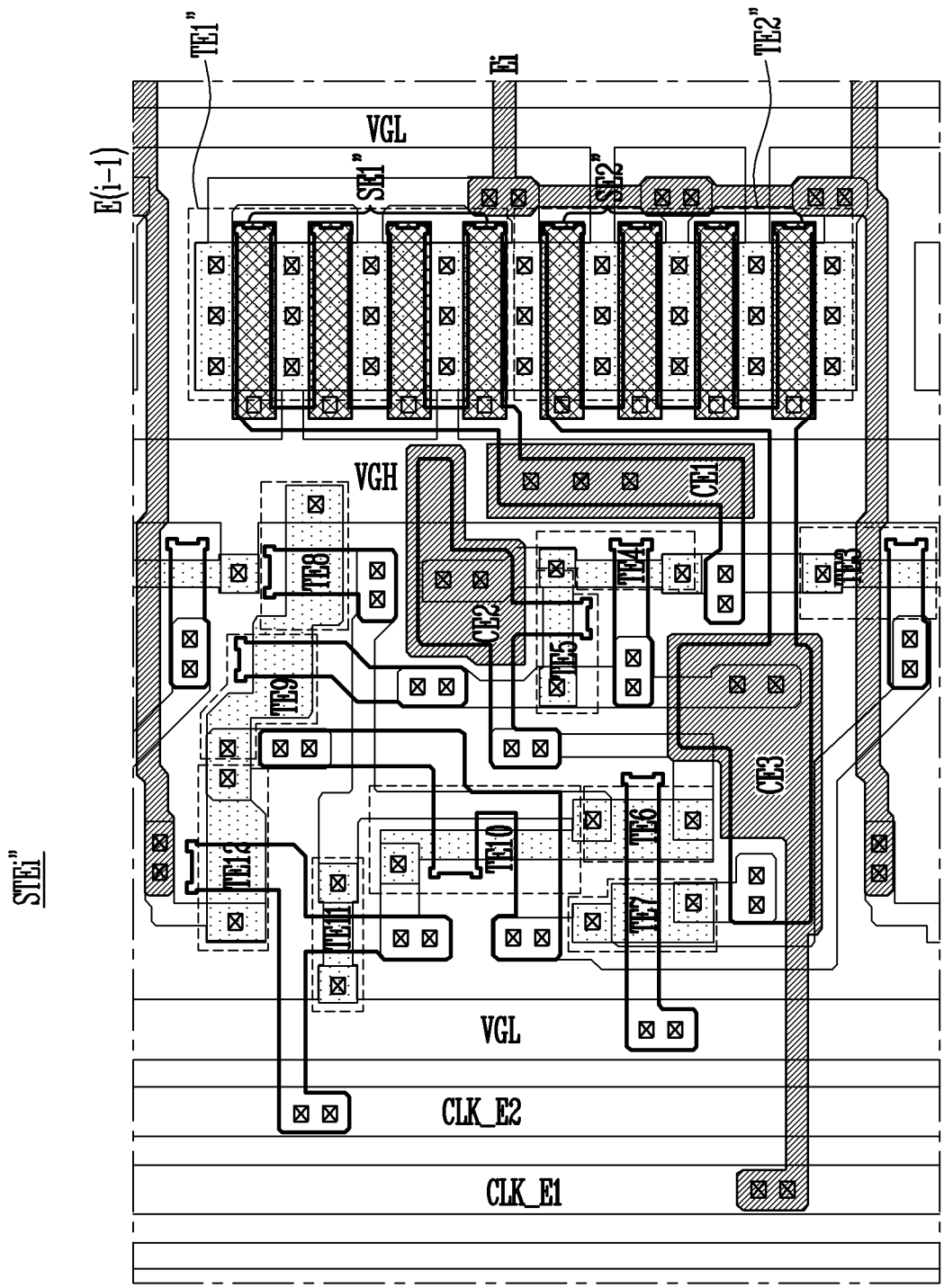
FIG. 10 is a diagram illustrating a layout of the emission control driver in accordance with the embodiment of FIG. 9.

FIG. 9 is a diagram illustrating an emission control driver 50" in accordance with an embodiment of the present disclosure. FIG. 10 is a diagram illustrating a layout of the emission control driver 50" in accordance with the embodiment of FIG. 9.

Referring to FIG. 9, the emission control driver 50" in accordance with the present embodiment may include emission control stages STE1", STE2", . . . .

In the embodiment of FIGS. 9 and 10, a first emission control transistor TE1" includes a sub-gate electrode SE1", and a second emission control transistor TE2" includes a sub-gate electrode SE2". Here, the sub-gate electrode SE1" of the first emission control transistor TE1" may be coupled to a main gate electrode of the first emission control transistor TE1". In addition, the sub-gate electrode SE2" of the second emission control transistor TE2" may be coupled to a main gate electrode of the second emission control transistor TE2". A stacked structure of the layout of FIG. 10 will be more clearly understood with reference also to FIG. 3.

In the present embodiment, a first supply voltage is applied from the first supply voltage line VGH to the first emission control line E1 directly via the first emission control transistor TE1". A second supply voltage is applied from the second supply voltage line VGL to the first emission control line E1 directly via the second emission control transistor TE2". Usually, the first and second emission control transistors TE1" and TE2" are buffer transistors designed such that a width/length ratio of a channel is comparatively high to make it possible to process a large amount of current.

It has been determined that, because the first and second emission control transistors TE1" and TE2" respectively include the sub-gate electrodes SE1" and SE2", the same performance as a conventional emission control transistor can be obtained despite a width/length ratio of a channel is low which enables a reduction in area occupied by the emission control transistor. Therefore, in the case where the first and second emission control transistors TE1" and TE2" are designed in the same manner as that of the embodiment of FIGS. 9 and 10, a dead space reducing effect may be obtained. In other words, the area of the plurality of pixels 20 corresponding to a display region may be increased, while the areas of line regions and the driving regions 31, 40, and 50 that correspond to a non-display region may be reduced.

Figure 11:
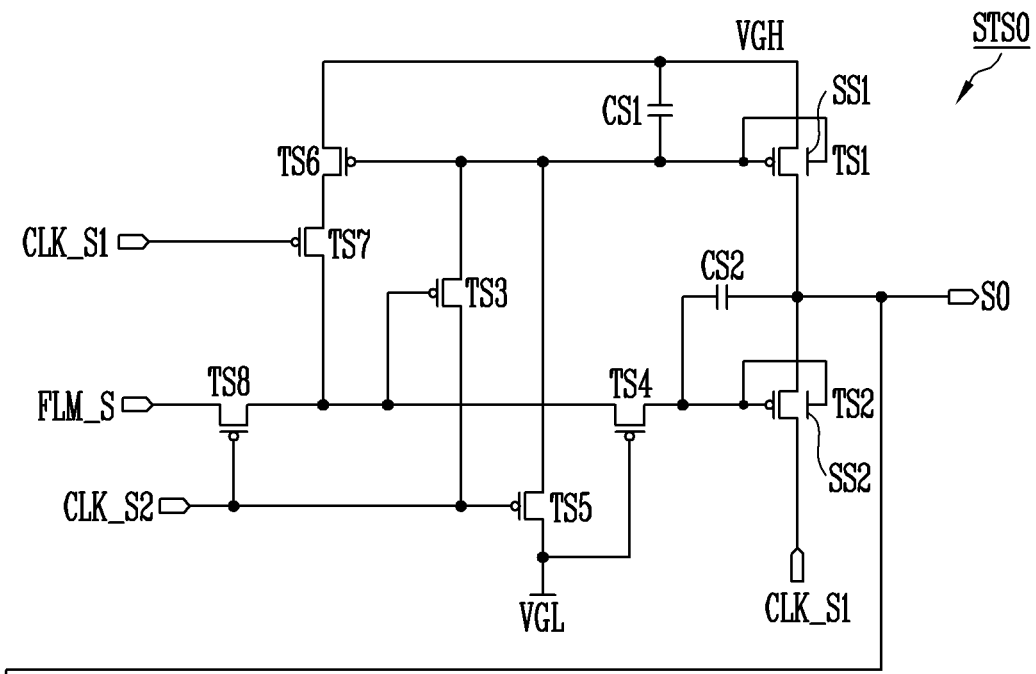
FIG. 11 is a diagram illustrating a scan driver in accordance with an embodiment of the present disclosure.
Figure 11:
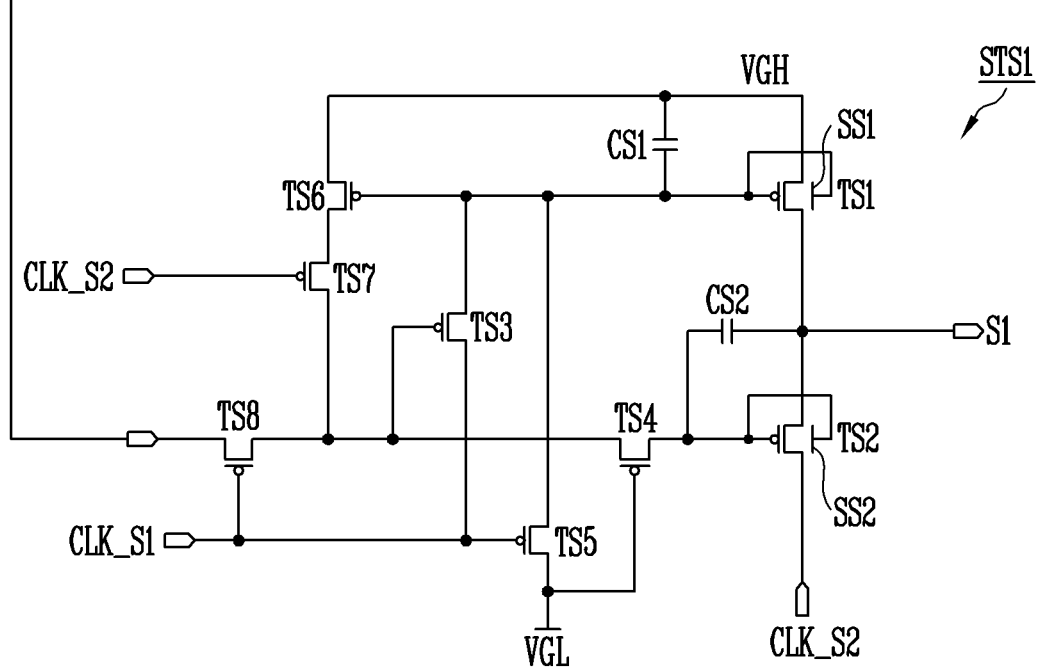
Figure 12:
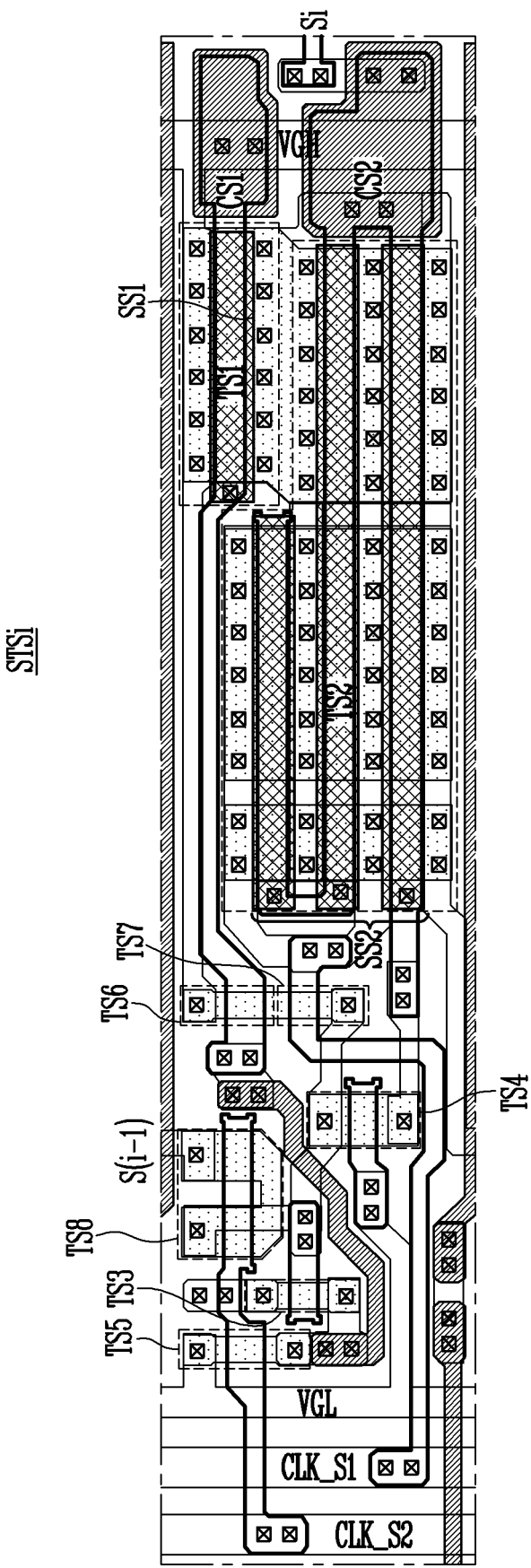
FIG. 12 is a diagram illustrating a layout of the scan driver in accordance with the embodiment of FIG. 11.

FIG. 11 is a diagram illustrating a scan driver 40 in accordance with an embodiment of the present disclosure. FIG. 12 is a diagram illustrating a layout of the scan driver 40 in accordance with the embodiment of FIG. 11.

Referring to FIG. 11, the scan driver 40 in accordance with the present embodiment may include scan stages STS0, STS1, . . . .

Each of the scan stages STS0, STS1, . . . may be configured in the form of a shift register in which a current scan stage outputs a current scan signal based on a preceding scan signal outputted from a preceding scan stage. However, the first scan stage STS0 may receive a scan start signal and operate based on the scan start signal because it cannot receive a preceding scan signal.

Each of the scan stages STS0, STS1, . . . may be coupled to a first scan clock line CLK_S1, a second scan clock line CLK_S2, a first supply voltage line VGH, and a second supply voltage line VGL. The first scan clock line CLK_S1 and the second scan clock line CLK_S2 may be sequentially alternately coupled to the scan stages STS0, STS1, . . . . Each of the scan stages STS0, STS1, . . . may selectively couple the first supply voltage line VGH or the corresponding scan clock line CLK_S1 or CLK_S2 to the corresponding scan line S0, S1, . . . .

The internal configurations of the scan stages STS0, STS1, . . . are substantially the same as each other; therefore, hereinafter, the first scan stage STS0 will be described as a current scan stage by way of example.

The first scan stage STS0 may include scan transistors TS1, TS2, TS3, TS4, TS5, TS6, TS7, and TS8 and capacitors CS1 and CS2.

The first scan transistor TS1 may include a first electrode coupled to the first supply voltage line VGH, a second electrode coupled to the scan line S0, a main gate electrode coupled to a second electrode of the capacitor CS1, and a sub-gate electrode SS1 coupled to the main gate electrode.

The second scan transistor TS2 may include a first electrode coupled to the scan line S0, a second electrode coupled to the first scan clock line CLK_S1, a main gate electrode coupled to a second electrode of the capacitor CS2, and a sub-gate electrode SS2 coupled to the main gate electrode.

The third scan transistor TS3 may include a first electrode coupled to the main gate electrode of the first scan transistor TS1, a second electrode coupled to the second scan clock line CLK_S2, and a gate electrode coupled to a first electrode of the eighth scan transistor TS8.

The fourth scan transistor TS4 may include a first electrode coupled to the main gate electrode of the second scan transistor TS2, a second electrode coupled to the first electrode of the eighth scan transistor TS8, and a gate electrode coupled to the second supply voltage line VGL.

The fifth scan transistor TS5 may include a first electrode coupled to the main gate electrode of the first scan transistor TS1, a second electrode coupled to the second supply voltage line VGL, and a gate electrode coupled to the second scan clock line CLK_S2.

The sixth scan transistor TS6 may include a first electrode coupled to the first supply voltage line VGH, a second electrode coupled to a first electrode of the seventh scan transistor TS7, and a gate electrode coupled to the main gate electrode of the first scan transistor TS1.

The seventh scan transistor TS7 may include the first electrode coupled to the second electrode of the sixth scan transistor TS6, a second electrode coupled to the first electrode of the eighth scan transistor TS8, and a gate electrode coupled to the first scan clock line CLK_S1.

The eighth scan transistor TS8 may include the first electrode coupled to the second electrode of the fourth scan transistor TS4, a second electrode coupled to a scan start line FLM_S, and a gate electrode coupled to the second scan clock line CLK_S2.

The capacitor CS1 may include a first electrode coupled to the first supply voltage line VGH, and the second electrode coupled to the main gate electrode and the sub-gate electrode SS1 of the first scan transistor TS1.

The capacitor CS2 may include a first electrode coupled to the scan line S0, and the second electrode coupled to the main gate electrode and the sub-gate electrode SS2 of the second scan transistor TS2.

Referring to FIG. 12, there is illustrated a layout of an arbitrary scan stage STSi. A stacked structure of the layout of FIG. 12 will be more clearly understood with reference also to FIG. 3.

In the embodiment of FIGS. 11 and 12, the first and second scan transistors TS1 and TS2 correspond to buffer transistors. Therefore, as described with reference to FIG. 10, a dead space reducing effect may be obtained by providing the sub-gate electrodes SS1 and SS2. In other words, the area of the plurality or pixels 20 corresponding to a display region may be increased, while the areas of the line regions and the driving regions 31, 40, and 50 that correspond to a non-display region may be reduced.

Figure 13:
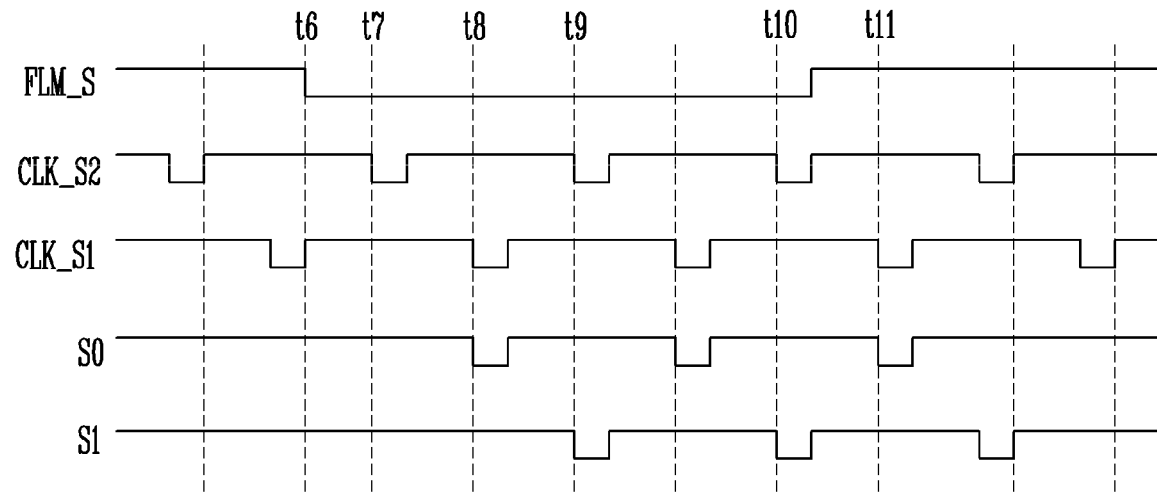
FIG. 13 is a diagram for explaining a method of driving the scan driver in accordance with the embodiment of FIG. 11.

FIG. 13 is a diagram for explaining a method of driving the scan driver in accordance with the embodiment of FIG. 11.

Hereinafter, a signal applied to the scan start line FLM_S will be referred to as a scan start signal. A signal applied to the first scan clock line CLK_S1 will be referred to as a first scan clock signal. A signal applied to the second scan clock line CLK_S2 will be referred to as a second scan clock signal. A signal applied to the current scan line S0 will be referred to as a current scan signal. A signal applied to a subsequent scan line S1 will be referred to a subsequent scan signal. In FIG. 13, there is illustrated the voltage level of each signal. In the description with reference to FIG. 13, the voltage level of each signal will be described as being one of a low level and a high level.

Times t6 to t11 of FIG. 13 have no continuity with times t1 to t5 of FIG. 5.

At time t6, the voltage level of the scan start signal is changed to a low level, the voltage level of the first scan clock signal is changed to a high level, and the second scan clock signal remains at a high level.

Hence, the scan transistors TS1, TS4, and TS6 are in a turned-on state, and the scan transistors TS2, TS3, TS5, TS7, and TS8 are in a turned-off state. Although the voltage level of the scan start signal has been changed to the low level, it does not affect the voltage level of the current scan line S0 because the eighth scan transistor TS8 is in the turned-off state.

At a point in time close to time t7, a falling pulse occurs in the second scan clock signal.

Here, because the scan start signal is at a low level, the scan transistors TS1, TS2, TS3, TS4, TS5, TS6 and TS8 is in a turned-on state, and the seventh scan transistor TS7 is in a turned-off state. Consequently, the first scan clock signal having the high level and the first supply voltage having the high level are simultaneously applied to the current scan line S0, so that the current scan signal remains at the high level.

Here, a voltage capable of keeping the second scan capacitor TS2 turned on is charged into the capacitor CS2.

At a point in time close to time t8, a falling pulse occurs in the first scan clock signal.

Here, since the second scan transistor TS2 remains turned on by the capacitor CS2, the falling pulse of the first scan clock signal is applied to the scan line S0. Thus, the current scan signal has a falling pulse at the point in time close to time t8.

Here, a boosting voltage having a level lower than the low level is applied to the main gate electrode and the sub-gate electrode of the second scan transistor TS2 by the capacitor CS2. Hence, the driving characteristics of the second scan transistor TS2 may be enhanced.

Furthermore, here, the scan transistors TS8, TS4, and TS2 of the subsequent scan stage STS1 are turned on, and a voltage capable of keeping the second scan transistor TS2 of the subsequent scan stage STS1 turned on is charged into the capacitor CS2 of the subsequent scan stage STS1.

At a point in time close to time t9, a falling pulse occurs in the second scan clock signal. In the subsequent scan stage STS1, the falling pulse of the second scan clock signal is applied to the subsequent scan line S1 by the second scan transistor TS2 that remains turned on. Thus, the subsequent scan signal has a falling pulse at the point in time close to time t9.

At a point in time close to time t10, a falling pulse occurs in the second scan clock signal, and the scan start signal FML_S remains at the low level. Hence, the subsequent scan signal has a falling pulse at the point in time close to time t10, in a manner similar to that of time t9.

At a point in time close to time t11, a falling pulse occurs in the first scan clock signal.

Here, although the scan start signal is at the high level, the eighth scan transistor TS8 is in the turned-off state. Thus, the second scan transistor TS2 remains turned on. Hence, the current scan signal has a falling pulse at the point in time close to time t11.

At a point in time after this, the scan start signal having the high level is reflected in the scan state STS0, so that the current scan signal remains at the high level.

In the present embodiment, there has been described the case where each scan signal has three falling pulses, but each scan signal may have two or less falling pulses or four or more falling pulses by adjusting the time for which the scan start signal FLMS_S remains at the low level.

Hereinafter, for the sake of description, the case where each scan signal has one falling pulse will be explained by way of example.

Figure 14:
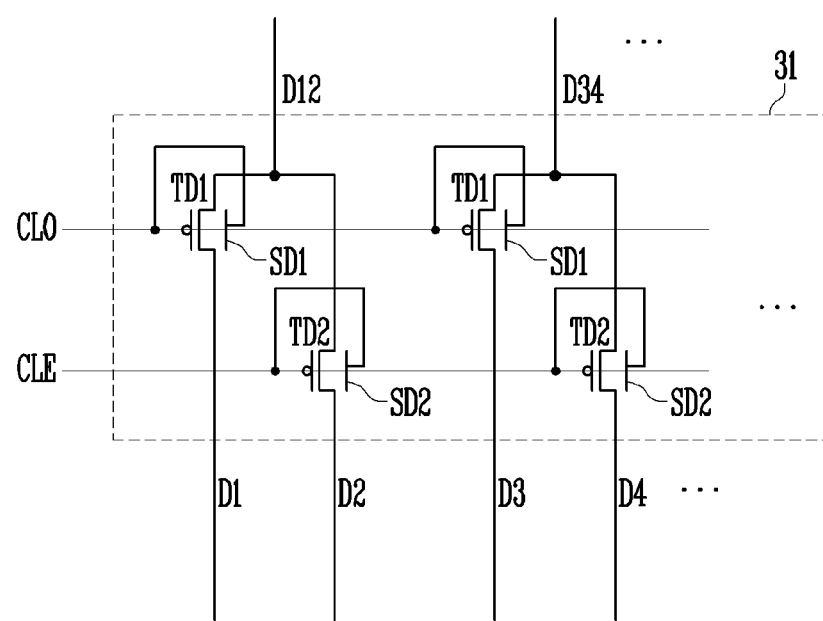
FIG. 14 is a diagram illustrating a demux unit in accordance with an embodiment of the present disclosure.
Figure 15:
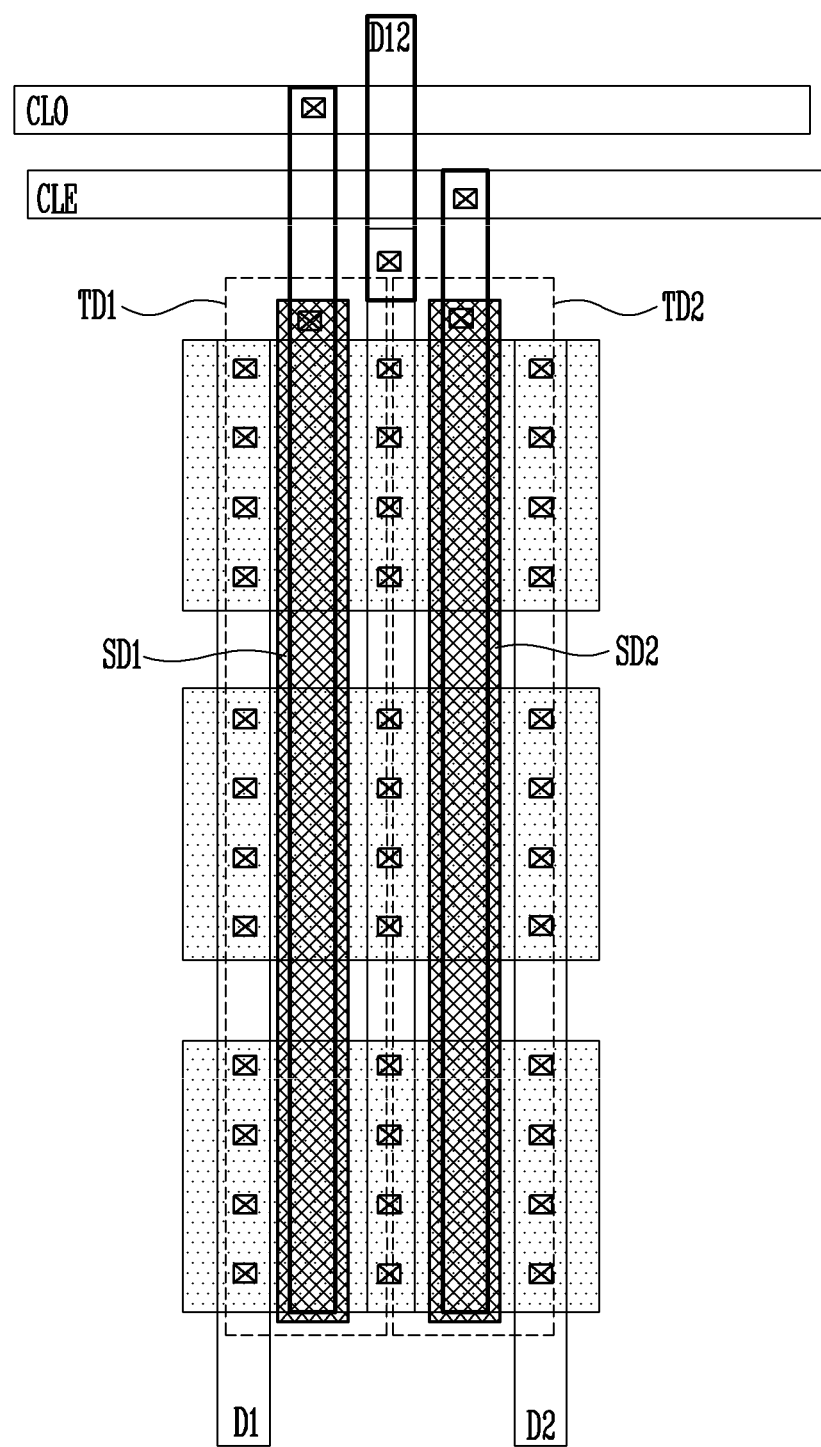
FIG. 15 is a diagram illustrating a layout of the demux unit in accordance with the embodiment of FIG. 14.

FIG. 14 is a diagram illustrating the demux 31 in accordance with an embodiment of the present disclosure. FIG. 15 is a diagram illustrating a layout of the demux 31 in accordance with the embodiment of FIG. 14. A stacked structure of the layout of FIG. 15 will be more clearly understood with reference also to FIG. 3.

The demux 31 in accordance with the present embodiment may include first demux transistors TD1 and second demux transistors TD2.

Each of the first demux transistors TD1 includes a first electrode coupled to a corresponding data supply line D12, D34, . . . , a second electrode coupled to a corresponding odd-number-th data line D1, D3, . . . , and a main gate electrode and a sub-gate electrode SD1 which are coupled to a first select control line CLO.

Each of the second demux transistors TD2 includes a first electrode coupled to a corresponding data supply line D12, D34, . . . , a second electrode coupled to a corresponding even-number-th data line D2, D4, . . . , and a main gate electrode and a sub-gate electrode SD2 which are coupled to a second select control line CLE.

In the embodiment of FIGS. 14 and 15, because the demux transistors TD1 and TD2 may include the sub-gate electrodes SD1 and SD2, a dead space reducing effect may be obtained in a manner similar to that of the preceding embodiments. In other words, the area of the plurality of pixels 20 corresponding to a display region may be increased, while the areas of line regions and the driving regions 31, 40, and 50 that correspond to a non-display region may be reduced.

Figure 16:
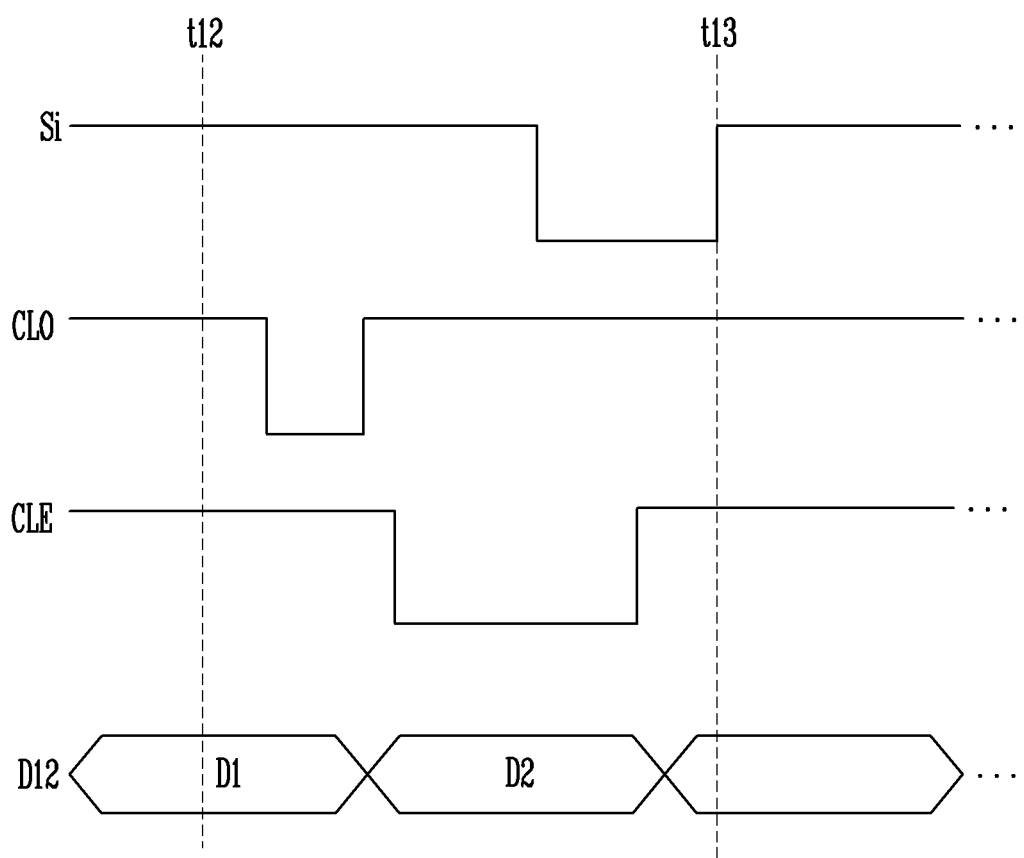
FIG. 16 is a diagram for explaining a method of driving the demux unit in accordance with the embodiment of FIG. 14.

FIG. 16 is a diagram for explaining a method of driving the demux 31 in accordance with the embodiment of FIG. 14.

Hereinafter, a signal applied to the scan line Si will be referred to as a scan signal. A signal applied to the first select control line CLO will be referred to as a first select control signal. A signal applied to the second select control line CLE will be referred to as a second select control signal. A signal applied to the data supply line D12 will be referred to as a data supply signal.

In FIG. 16, an interval between time t12 and time t13 may refer to one horizontal period. Times t12 to t13 of FIG. 16 have no continuity with times t1 to t11 of FIGS. 5 and 13.

Hereinafter, for the sake of description, the operation of only the demux transistors TD1 and TD2 pertaining to the first data line D1 and the second data line D2 will be explained. The demux 31 may couple the data supply line D12 to one of the first data line D1 and the second data line D2.

When the scan signal remains at a high level, a first select scan signal having a low level is applied so that the first demux transistor TD1 is turned on. Here, because the second select scan signal is in a high level, the second demux transistor TD2 is in a turned-off state. Therefore, the data supply line D12 and the first data line D1 are coupled with each other, so that the data supply signal is supplied to the first data line D1. In an embodiment, the first data line D1 may be coupled with a first data storage capacitor. The first data storage capacitor may store the supplied data supply signal.

Subsequently, the second select scan signal having a low level is applied so that the second demux transistor TD2 is turned on. Here, because the first select scan signal is in a high level, the first demux transistor TD1 is in a turned-off state. Therefore, the data supply line D12 and the second data line D2 are coupled with each other, so that the data supply signal is supplied to the second data line D2. Here, while the second select scan signal remains at a low level, the voltage level of the scan signal may be changed to the low level. Hence, the data supply signal supplied to the second data line D2 may be directly applied to a second pixel as a data voltage. Thus, there may be no need for the second data line D2 to have a second data storage capacitor. In some embodiments, the second data line D2 may include the second data storage capacitor.

When the voltage level of the scan signal is changed to the low level, the data supply signal that has been stored in the first data storage capacitor may be supplied to a first pixel as a first data voltage.

Figure 17:
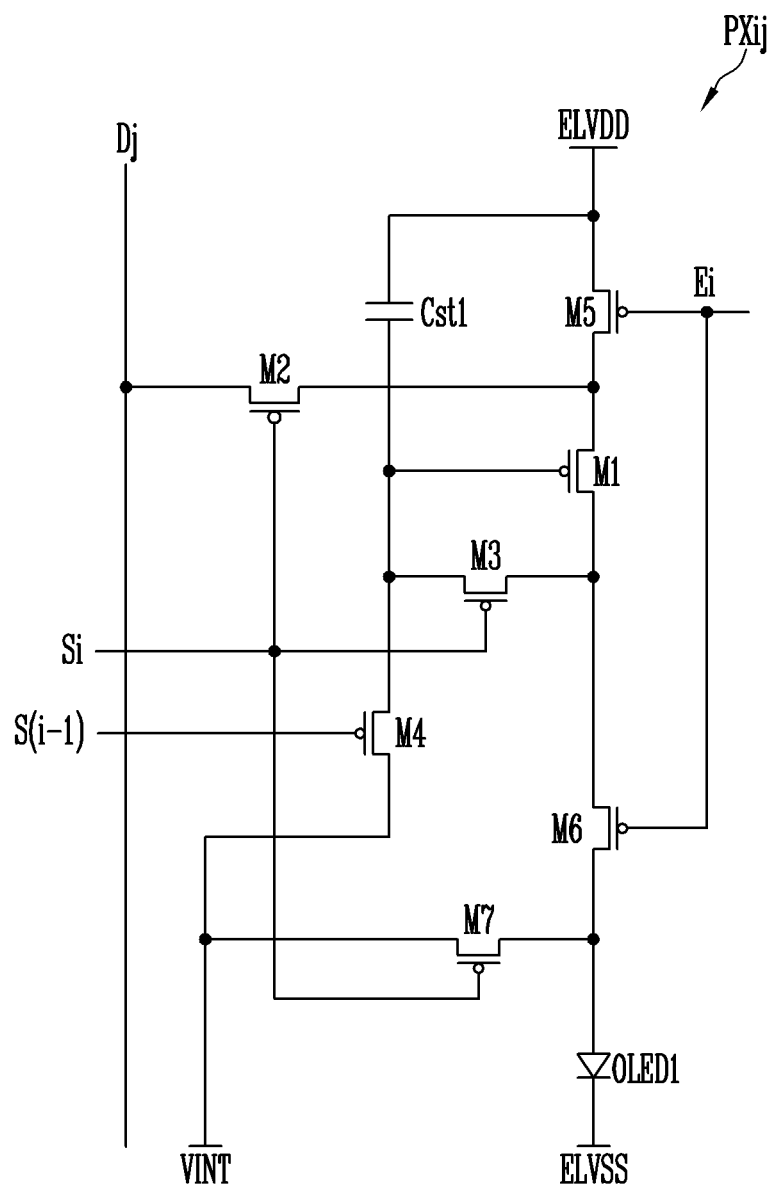
FIG. 17 is a diagram illustrating a pixel in accordance with an embodiment of the present disclosure.

FIG. 17 is a diagram illustrating a pixel PXij in accordance with an embodiment of the present disclosure.

Referring to FIG. 17, the pixel PXij may include transistors M1, M2, M3, M4, M5, M6, and M7, a storage capacitor Cst1, and an organic light-emitting diode OLED1.

The storage capacitor Cst1 may include a first electrode coupled to a first driving voltage line ELVDD, and a second electrode coupled to a gate electrode of the transistor M1.

The transistor M1 may include a first electrode coupled to a second electrode of the transistor M5, a second electrode coupled to a first electrode of the transistor M6, and a gate electrode coupled to the second electrode of the storage capacitor Cst1. The transistor M1 may be referred to as a driving transistor. The transistor M1 may determine the amount of driving current flowing between the first driving voltage line ELVDD and a second driving voltage line ELVSS.

The transistor M2 may include a first electrode coupled to the data line Dj, a second electrode coupled to the first electrode of the transistor M1, and a gate electrode coupled to the current scan line Si. The transistor M2 may be referred to as a switching transistor. When a scan signal having a turn-on level is applied to the current scan line Si, the transistor M2 applies the data voltage of the data line Dj to the pixel PXij.

The transistor M3 may include a first electrode coupled to the second electrode of the transistor M1, a second electrode coupled to the gate electrode of the transistor M1, and a gate electrode coupled to the current scan line Si. When a scan signal having a turn-on level is applied to the current scan line Si, the transistor M3 may couple the first transistor M1 in the form of a diode.

The transistor M4 may include a first electrode coupled to the gate electrode of the transistor M1, a second electrode coupled to an initialization voltage line VINT, and a gate electrode coupled to a preceding scan line S(i−1). In an embodiment, the gate electrode of the transistor M4 may be coupled to other scan lines. When a scan signal having a turn-on level is applied to the preceding scan line S(i−1), the transistor M4 may transmit the initialization voltage VINT to the gate electrode of the transistor M1, thus initializing the amount of electric charges of the gate electrode of the transistor M1.

The transistor M5 may include a first electrode coupled to the first driving voltage line ELVDD, the second electrode coupled to the first electrode of the transistor M1, and a gate electrode coupled to an emission control line Ei. The transistor M6 may include the first electrode coupled to the second electrode of the transistor M1, a second electrode coupled to an anode of the organic light-emitting diode OLED1, and a gate electrode coupled to the emission control line Ei. When an emission control signal having a turn-on level is applied, the transistors M5 and M6 may form a driving current path between the first driving voltage line ELVDD and the second driving voltage line ELVSS so that the organic light-emitting diode OLED1 emits light.

The transistor M7 may include a first electrode coupled to the anode of the organic light-emitting diode OLED1, a second electrode coupled to the initialization voltage line VINT, and a gate electrode coupled to the current scan line Si. In an embodiment, the gate electrode of the transistor M7 may be coupled to other scan lines. When a scan signal having a turn-on level is applied to the current scan line Si, the transistor M7 may transmit the initialization voltage VINT to the anode of the organic light-emitting diode OLED1, thus initializing the amount of electric charges accumulated in the organic light-emitting diode OLED1.

The organic light-emitting diode OLED1 may include the anode coupled to the second electrode of the transistor M6, and a cathode coupled to the second driving voltage line ELVSS.

Figure 18:
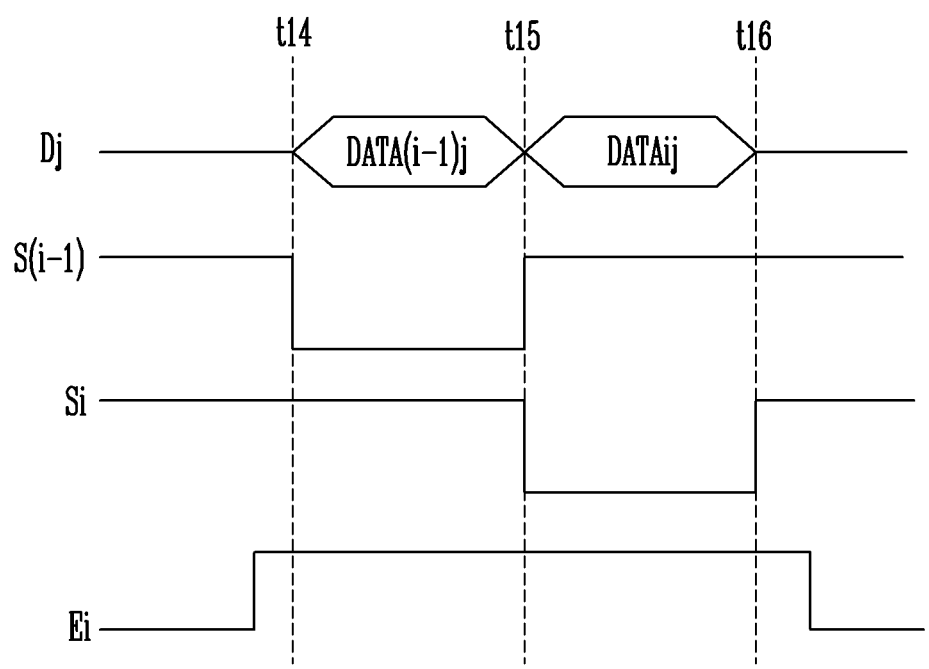
FIG. 18 is a diagram for explaining a method of driving a pixel in accordance with the embodiment of FIG. 17.

FIG. 18 is a diagram for explaining a method of driving a pixel PXij in accordance with the embodiment of FIG. 17.

Times t14 to t16 of FIG. 18 have no continuity with times t1 to t13 of FIGS. 5, 13, and 16. Each of a period t14 to t15 and a period t15 to t16 may correspond to one horizontal period. In FIG. 18, illustration of widths of a data signal, a scan signal, and an emission control signal is simplified for the sake of explanation of the operation of the pixel PXij. The actual widths of the data signal, the scan signal, and the emission control signal of FIG. 18 may be further reduced or increased.

During the period t14 to t15, a data voltage DATA(i−1)j for a preceding pixel row is applied to the data line Dj, and a scan signal having a turn-on level (low level) is applied to a preceding scan line S(i−1).

Because a scan signal having a turn-off level (high level) is applied to the current scan line Si, the transistor M2 is in the turned-off state, and the data voltage for the preceding pixel row DATA(i−1)j is prevented from being applied to the pixel PXij.

Here, since the transistor M4 is turned on, the initialization voltage is applied to the gate electrode of the transistor M1 so that the amount of electric charges thereof is initialized. Since an emission control signal having a turn-off level is applied to the emission control line Ei, the transistors M5 and M6 are turned off, so that the organic light-emitting diode OLED1 may be prevented from unnecessarily emitting light during the process of applying the initialization voltage VINT.

During the period t15 to t16, a data voltage DATAij for a current pixel row is applied to the data line Dj, and a scan signal having a turn-on level is applied to the current scan line Si. Thus, the transistors M2, M3, and M7 are turned on, and the data line Dj and the first electrode of the transistor M1 are electrically connected to each other. Hence, the data voltage DATAij is applied to the second electrode of the storage capacitor Cst1, and the storage capacitor Cst1 accumulates the amount of electric charges corresponding to a difference between the voltage of the first driving voltage line ELVDD and the data voltage DATAij.

Here, since the transistor M7 is in the turned-on state, the initialization voltage VINT is applied to the anode of the organic light-emitting diode OLED1, and the organic light-emitting diode OLED1 is initialized or precharged to the amount of electric charges corresponding to a difference between the initialization voltage and the voltage of the second driving voltage line ELVSS.

After time t16, an emission control signal having a turn-on level is applied to the emission control line Ei, so that the transistors M5 and M6 are turned on, and driving current flows to the organic light-emitting diode OLED1 while the amount of driving current flowing through the transistor M1 is adjusted depending on the amount of electric charges accumulated in the storage capacitor Cst1. The organic light-emitting diode OLED1 emits light until an emission control signal having a turn-off level is applied to the emission control line Ei.

As described above, various embodiments of the present disclosure may provide a display device using a sub-gate electrode, thus preventing current leakage, and reducing a dead space.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:
1. A display device comprising:
a first pixel coupled to a scan line; and
a scan stage configured to selectively couple the scan line to a first supply voltage line or a scan clock line,
wherein the scan stage comprises:
a first scan transistor including a first electrode coupled to the first supply voltage line, a second electrode coupled to the scan line, and a main gate electrode and a sub-gate electrode coupled to each other;

a second scan transistor including a first electrode coupled to the scan line, a second electrode coupled to the scan clock line, and a main gate electrode and a sub-gate electrode coupled to each other; and a third scan transistor including a first electrode coupled to the main gate electrode and the sub-gate electrode of the second scan transistor and a gate electrode coupled to a second supply voltage line which supplies voltage lower than voltage supplied from the first supply voltage line.

2. The display device according to claim 1, wherein the main gate electrode of the first scan transistor and the main gate electrode of the second scan transistor are disposed over the active layer, and wherein the sub-gate electrode of the first scan transistor and the sub-gate electrode of the second scan transistor are disposed under the active layer.

* * * * *